US009806726B2

(12) United States Patent
Adachi

(10) Patent No.: US 9,806,726 B2
(45) Date of Patent: Oct. 31, 2017

(54) SPREAD SPECTRUM CLOCK GENERATOR

(71) Applicant: Renesas Electronics Corporation, Tokyo (JP)

(72) Inventor: Fumiyuki Adachi, Kanagawa (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 15/490,519

(22) Filed: Apr. 18, 2017

(65) Prior Publication Data

US 2017/0222652 A1 Aug. 3, 2017

Related U.S. Application Data

(63) Continuation of application No. 14/804,704, filed on Jul. 21, 2015, now Pat. No. 9,660,657.

(30) Foreign Application Priority Data

Aug. 12, 2014 (JP) ................................ 2014-164351

(51) Int. Cl.

| | |
|---|---|
| ***H03L 7/06*** | (2006.01) |
| ***H03L 7/189*** | (2006.01) |
| ***H03M 7/30*** | (2006.01) |
| ***H04B 1/707*** | (2011.01) |
| *H03L 7/089* | (2006.01) |
| *H03L 7/093* | (2006.01) |

(52) U.S. Cl.

CPC .......... *H03L 7/189* (2013.01); *H03M 7/3026* (2013.01); *H04B 1/707* (2013.01); *H03L 7/0891* (2013.01); *H03L 7/093* (2013.01)

(58) Field of Classification Search

None

See application file for complete search history.

(56) References Cited

U.S. PATENT DOCUMENTS

| | | | |
|---|---|---|---|
| 8,270,553 B2 | 9/2012 | Ogasawara et al. | |
| 9,660,657 B2 * | 5/2017 | Adachi | .................. H03L 7/189 |
| 2007/0153129 A1 | 7/2007 | Kawamoto | |
| 2008/0100486 A1 | 5/2008 | Lin | |
| 2011/0006936 A1 | 1/2011 | Lin | |
| 2012/0242384 A1 | 9/2012 | Kato | |
| 2014/0177681 A1 | 6/2014 | Chung | |

FOREIGN PATENT DOCUMENTS

| | | |
|---|---|---|
| JP | 2010-035015 A | 2/2010 |

* cited by examiner

*Primary Examiner* — Cassandra Cox

(74) *Attorney, Agent, or Firm* — Sughrue Mion, PLLC

(57) ABSTRACT

A spread spectrum clock generator includes: a phase comparing unit that receives a reference clock signal and a feedback clock signal, and generates a control voltage corresponding to a phase difference between the reference clock signal and the feedback clock signal; a voltage-controlled oscillator that oscillates at an oscillating frequency corresponding to the control voltage, and generates an output clock signal; a delta-sigma modulator that receives a waveform signal for controlling spreading of a spectrum of the output clock signal, and outputs bits larger than 1 bit based on the waveform signal; a control circuit that controls a multiplication number according to an output signal of the delta-sigma modulator; and a divider that generates the feedback clock signal by dividing the output clock signal according to the multiplication number controlled by the control circuit, and supplies the feedback clock signal to the phase comparing unit.

9 Claims, 26 Drawing Sheets

1

RELATED ART

SPREAD SPECTRUM CLOCK GENERATOR

CROSS-REFERENCE TO RELATED APPLICATIONS

This application is a Continuation of U.S. application Ser. No. 14/804,704, filed on Jul. 21, 2015, which claims the benefit of priority from Japanese patent application No. 2014-164351, filed on Aug. 12, 2014, the disclosure of which is incorporated herein in its entirety by reference.

BACKGROUND

The present disclosure relates to a spread spectrum clock generator, and, more particularly, relates to generation of a spread spectrum clock by using, for example, a delta-sigma modulator.

A spread spectrum clock generator (SSCG) is used to prevent occurrence of an EMI (Electro-Magnetic Interference) caused by an electronic device. The SSCG generates a spread spectrum clock signal by modulating, according to a predetermined modulation frequency and the degree of modulation, the frequency of a clock signal which is generated by a PLL (phase locked loop) or the like.

The SSCG disclosed in Japanese Unexamined Patent Application Publication No. 2010-035015 cyclically increases or decreases a phase difference between a feedback clock signal and a reference clock signal to be inputted to a phase comparing unit, by causing a phase interpolator disposed on a feedback path to advance or delay the phase of an output clock signal of a voltage-controlled oscillator, and modulates the frequency of the output clock signal.

Further, there is an SSCG which causes a delta-sigma modulator to delta-sigma modulate a waveform signal for controlling spreading of the spectrum of an output clock, and modulates the frequency of the output clock based on a resulting compressional wave.

SUMMARY

The inventors of the present invention have found the following problem.

A spread spectrum clock generator which uses a delta-sigma modulator produces a spurious component caused by the delta-sigma modulator.

Other problems and new features will be more apparent from the description and accompanying drawings of this description.

According to one embodiment, a spread spectrum clock generator includes a delta-sigma modulator that outputs bits larger than 1 bit based on a waveform signal for controlling spreading of a spectrum of the output clock signal, and a divider that divides the output clock signal according to a multiplication number controlled according to an output signal of the delta-sigma modulator.

According to the one embodiment, it is possible to prevent generation of a spurious component caused by generation of a spread spectrum clock.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Figure 1:
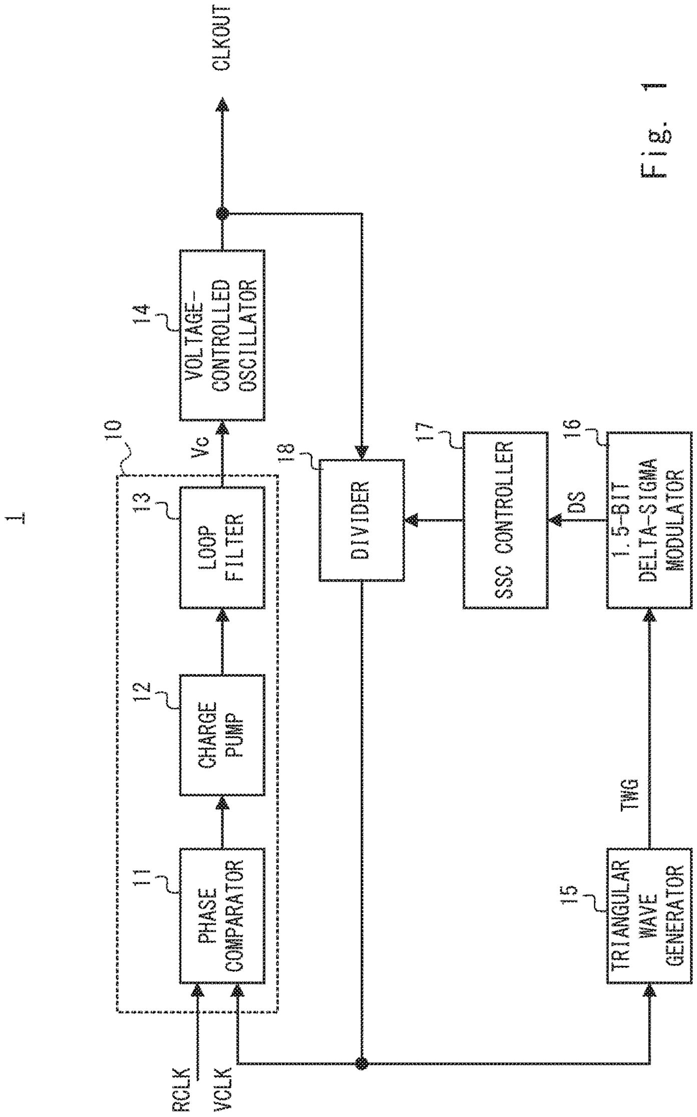
FIG. 1 is a block diagram illustrating a configuration of an SSCG according to a first embodiment.

The following description and drawings will be optionally omitted or simplified for clarification of explanation. In addition, the same elements will be assigned the same reference numerals in each drawing, and overlapping descriptions will be omitted when necessary.

<Advance Study>

Contents of the advance study which the inventors have made will be described prior to explanation of the embodiments.

Figure 21:
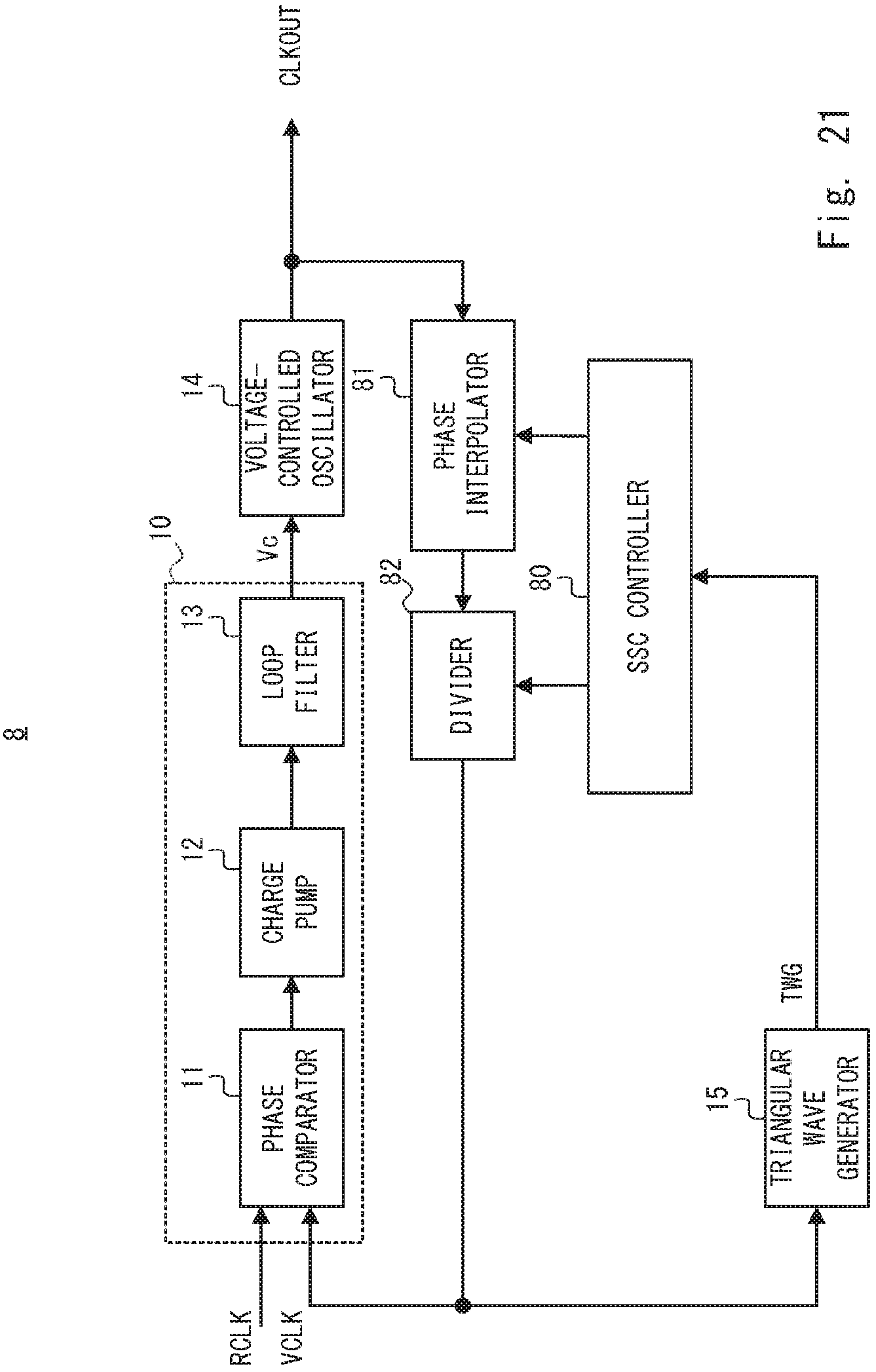
FIG. 21 is a block diagram illustrating a configuration of an SSCG according to a first comparative example.

FIG. 21 is a block diagram illustrating a configuration of an SSCG (Spread Spectrum Clock Generator) 8 according to a first comparative example. The SSCG 8 includes a phase comparing unit 10, a voltage-controlled oscillator (VCO) 14, a triangular wave generator 15, an SSC controller 80, a phase interpolator 81 and a divider 82.

The phase comparing unit 10 receives a reference clock signal RCLK and a feedback clock signal VCLK, and generates a control voltage Vc corresponding to a phase difference between the reference clock signal RCLK and the clock signal VCLK. According to a configuration illustrated in FIG. 21, the phase comparing unit 10 includes a phase comparator 11, a charge pump 12 and a loop filter 13.

The phase comparator 11 generates a phase difference signal indicating the phase difference between the reference clock signal RCLK and the feedback clock signal VLCK. The charge pump 12 outputs a current corresponding to the phase difference signal generated by the phase comparator 11, to the loop filter 13. The loop filter 13 smooths and integrates currents supplied from the charge pump 12, and generates the control voltage Vc.

The voltage-controlled oscillator 14 oscillates at an oscillating frequency corresponding to the control voltage Vc, and generates an output clock signal CLKOUT. The triangular wave generator (waveform generator circuit) 15 generates a triangular wave TWG which is a triangular wave signal of a predetermined modulation frequency as a waveform signal for controlling spreading of the spectrum of the output clock signal CLKOUT by using the feedback clock signal.

The SSC controller 80 transmits a control signal to the phase interpolator 81 and the divider 82 based on the triangular wave TWG generated by the triangular wave generator 15. When, for example, the reference clock signal RCLK is multiplied by 100, and when the spectrum is spread at the degree of modulation ±1%, the SSC controller 80 controls the divider 82 to cyclically repeat multiplication numbers of 101 and 99 at the modulation frequency of the triangular wave TWG. Further, the SSC controller 80 controls the phase interpolator 81 to advance or delay a phase according to the magnitude of the amplitude of the triangular wave TWG. The multiplication numbers set by the divider 82 are 101 and 99 in the above example. However, it is possible to realize fine multiplication settings corresponding to a waveform of the triangular wave TWG by using the divider 82 and phase shifting of the phase interpolator 81 in combination.

The phase interpolator 81 shifts the phase of the output clock signal CLKOUT by a phase shift amount specified according to a control signal from the SSC controller 80. Further, the phase interpolator 81 outputs the phase-shifted clock signal to the divider 82. The divider 82 divides the clock signal inputted from the phase interpolator 81, by the multiplication number specified according to the control signal from the SSC controller 80, and generates the feedback clock signal VCLK. The feedback clock signal VCLK outputted from the divider 82 is supplied to the phase comparator 11 and the triangular wave generator 15.

Figure 22:
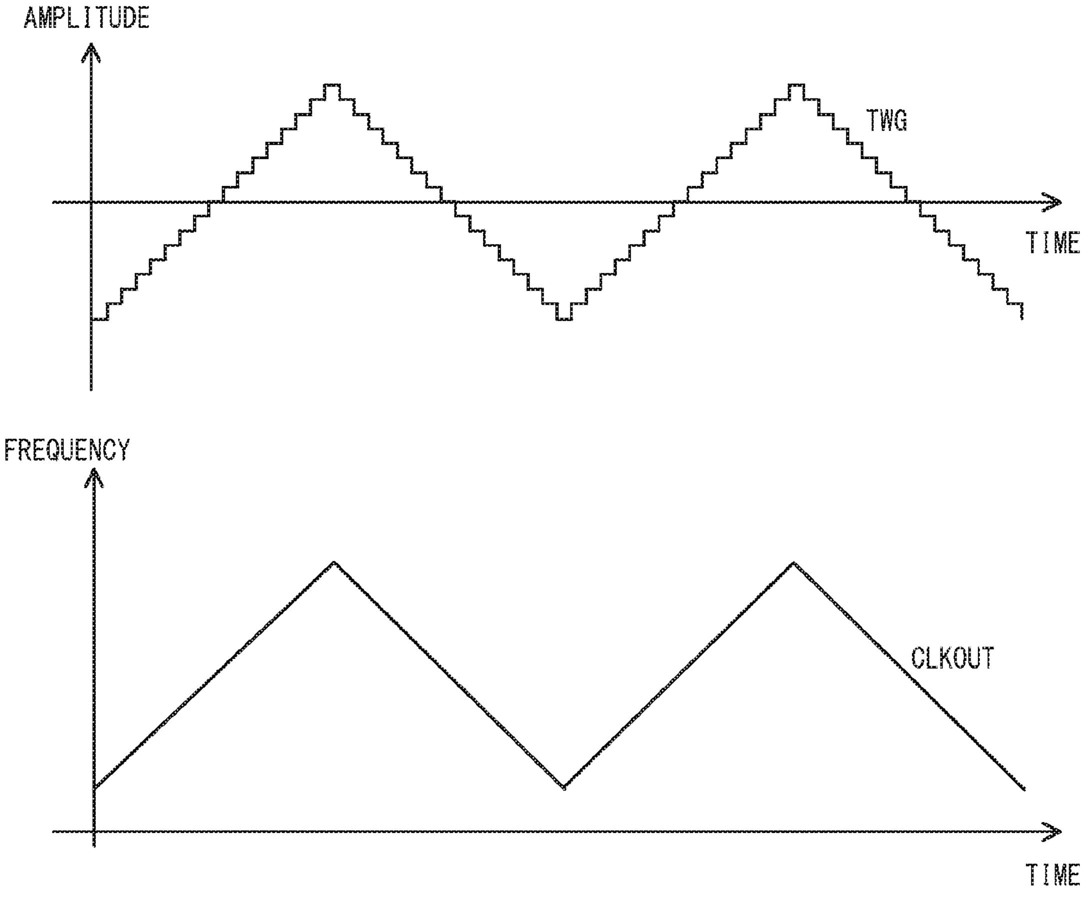
FIG. 22 shows graphs illustrating operation waveforms of the SSCG according to the first comparative example.

The SSCG 8 according to the first comparative example spreads the spectrum by dynamically changing a multiplication number set by using the divider 82 and the phase interpolator 81 in combination, by using the triangular wave TWG, and spreading the frequency of the output clock signal CLKOUT. FIG. 22 shows graphs illustrating operation waveforms of the SSCG 8 according to the first comparative example, the upper graph illustrating a temporal transition of the amplitude of the triangular wave TWG generated by the triangular wave generator 15 and the lower graph illustrating a temporal transition of the frequency of the output clock signal CLKOUT. As illustrated in FIG. 22, the frequency of the output clock signal CLKOUT temporally changes as the amplitude of the triangular wave TWG makes a temporal transition.

Figure 23:
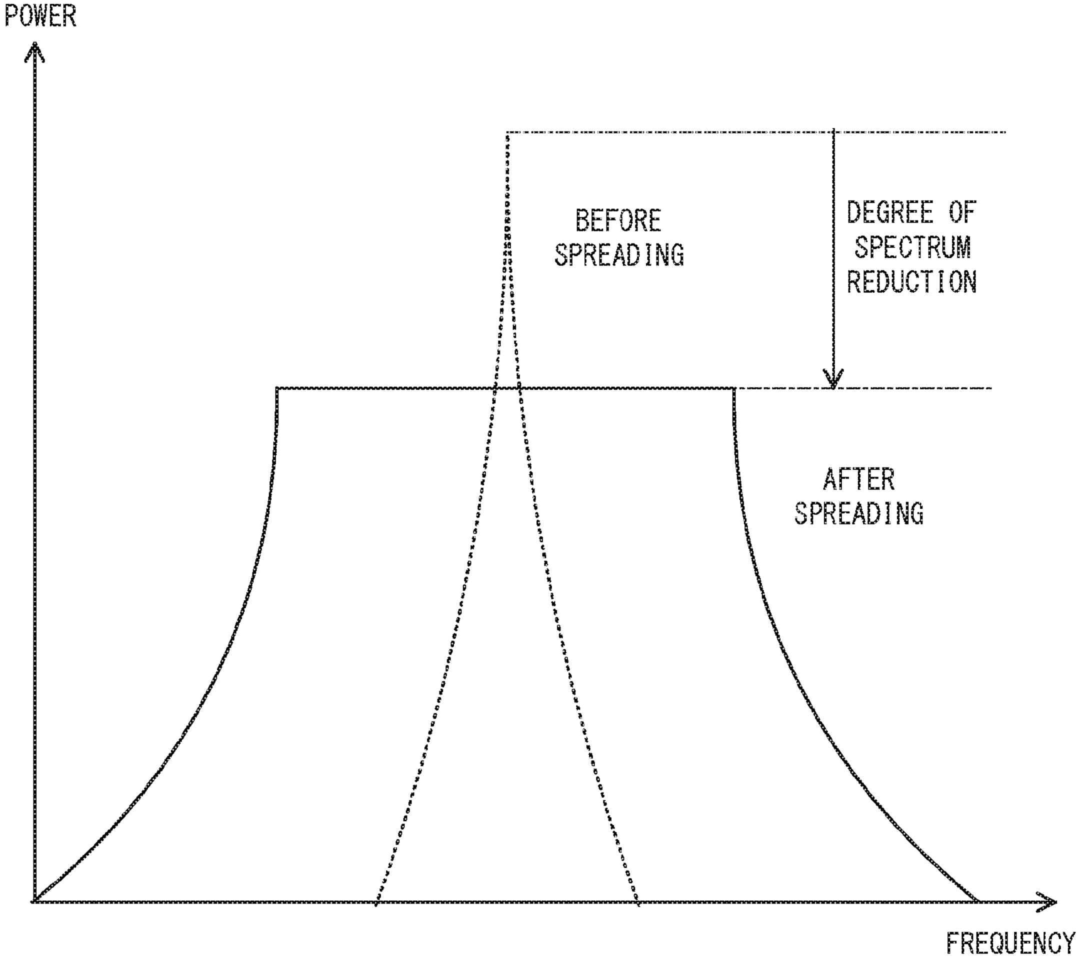
FIG. 23 shows a graph illustrating a frequency spectrum of an output clock signal of the SSCG according to the first comparative example.

FIG. 23 shows a graph illustrating a frequency spectrum of the output clock signal CLKOUT of the SSCG 8 according to the first comparative example. In addition, in FIG. 23, a solid line indicates the frequency spectrum of the output clock signal CLKOUT of the SSCG 8 according to the first comparative example, and a broken line indicates a frequency spectrum before spectrum spreading. By performing spectrum spreading, the SSCG 8 reduces maximum power compared to a case where the output cock signal CLKOUT is outputted at a fixed frequency, i.e., compared to a case before spectrum spreading. Consequently, as illustrated in FIG. 23, a peak of the frequency spectrum of the output clock signal CLKOUT of the SSCG 8 is suppressed compared to a peak before spreading.

As described above, by using the divider 82 and, in addition, the phase interpolator 81, it is possible to realize a fine multiplication setting compared to a multiplication setting made by only the divider 82, and obtain the frequency spectrum illustrated in FIG. 23. Further, it is also possible to configure a spread spectrum clock generator without using the phase interpolator 81. A spread spectrum clock generator which does not use the phase interpolator 81 will be described below as the second comparative example.

Figure 24:
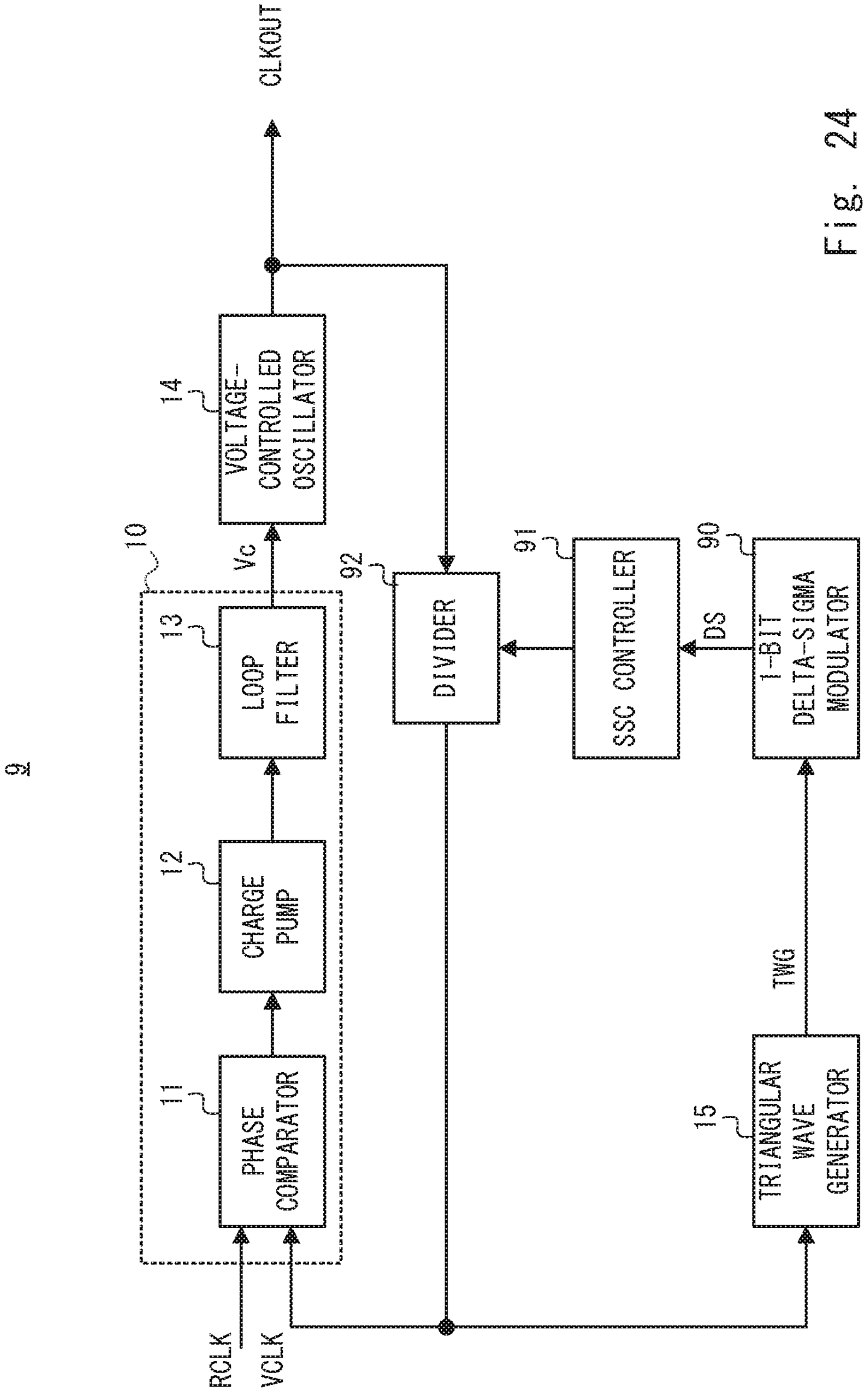
FIG. 24 is a block diagram illustrating a configuration of an SSCG according to a second comparative example.

FIG. 24 is a block diagram illustrating a configuration of an SSCG 9 according to the second comparative example. The SSCG 9 includes a phase comparing unit 10, a voltage-controlled oscillator 14, a triangular wave generator 15, a delta-sigma modulator 90, an SSC controller 91 and a divider 92. The SSCG 9 according to the second comparative example differs from an SSCG 8 according to the first comparative example mainly in that a phase interpolator 81 is not provided and the delta-sigma modulator 90 is added.

The delta-sigma modulator 90 is a first-order delta-sigma modulator which delta-sigma modulates amplitude components of a triangular wave TWG generated by the triangular wave generator 15, and outputs a 1-bit digital value (output signal DS). The SSC controller 91 transmits a control signal to the divider 92 based on the output signal DS from the delta-sigma modulator 90. The divider 92 divides an output clock signal CLKOUT outputted from the voltage-controlled oscillator 14, according to the control signal from the SSC controller 91, and generates a feedback clock signal VCLK. The feedback clock signal VCLK outputted from the divider 92 is supplied to a phase comparator 11 of the phase comparing unit 10 and the triangular wave generator 15. An operation of the delta-sigma modulator 90 will be described in detail below.

Figure 25:
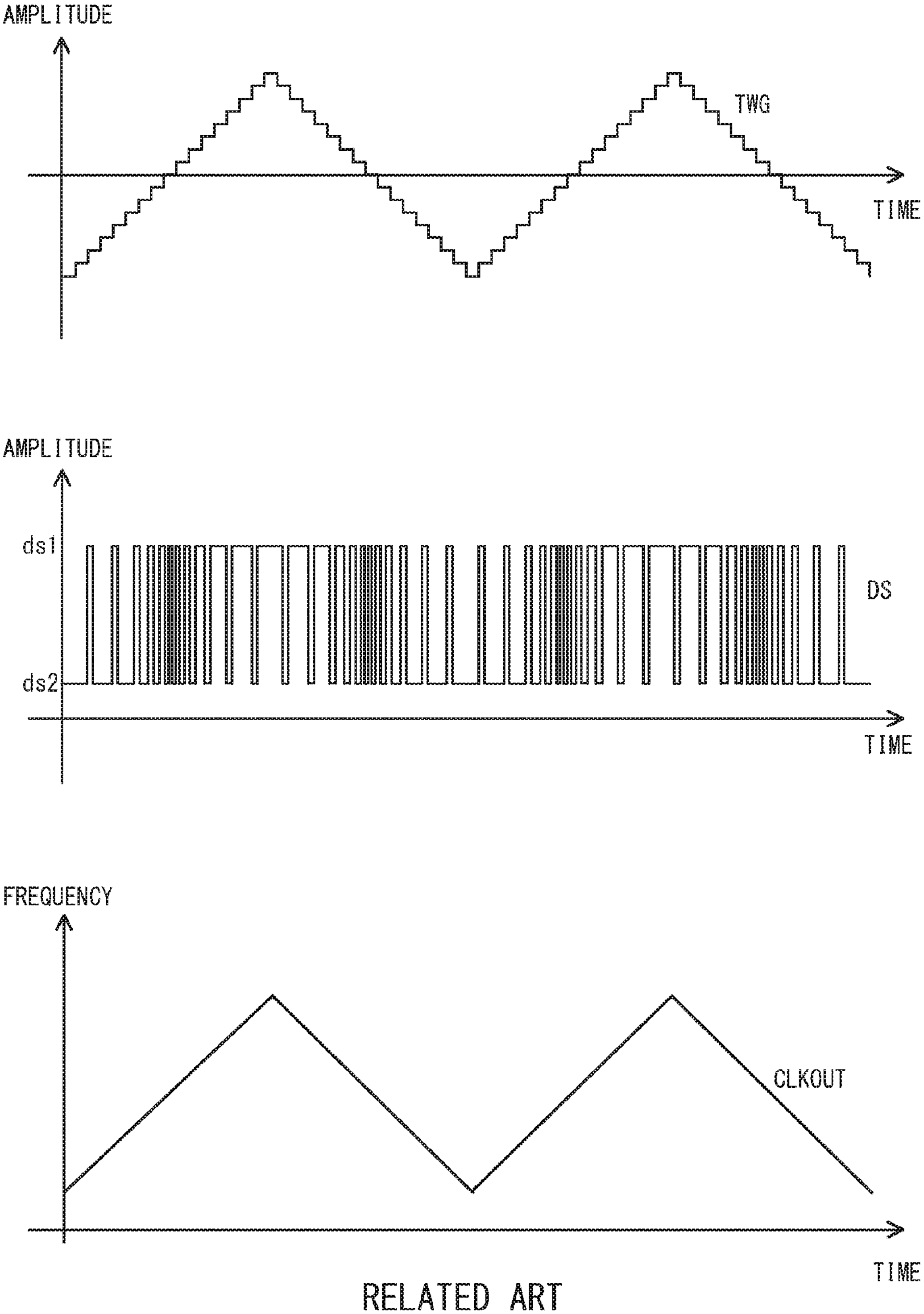
FIG. 25 illustrates graphs illustrating operation waveforms of the SSCG according to the second comparative example.

FIG. 25 shows graphs illustrating operation waveforms of the SSCG 9 according to the second comparative example. In addition, in FIG. 25, the upper graph illustrates a temporal transition of the amplitude of the triangular wave TWG generated by the triangular wave generator 15, the middle graph illustrates a temporal transition of the output signal DS of the delta-sigma modulator 90 and the lower graph indicates a temporal transition of the frequency of the output clock signal CLKOUT.

As illustrated in the middle graph in FIG. 25, the delta-sigma modulator 90 converts the triangular wave TWG into a compressional wave having binary amplitudes. Hence, the output signal DS of the delta-sigma modulator 90 repeats alternately taking a signal value ds1 and a signal value ds2 as the time transitions. However, continuation times of the signal value ds1 and the signal value ds2 differ according to values of the triangular wave TWG.

More specifically, the continuation times of the signal value ds1 and the signal value ds2 fluctuate as follows. In addition, the signal value ds1 is larger than the signal value ds2. When the value of the triangular wave TWG inputted to the delta-sigma modulator 90 fluctuates from a minimum value to a maximum value, a ratio of the continuation time of the signal value ds1 to the continuation time of the signal value ds2 becomes larger as the value of the triangular wave TWG to be inputted becomes larger. Hence, when the value of the triangular wave TWG takes on the maximum value, the continuation time of the signal value ds1 becomes the maximum. Further, when the value of the triangular wave TWG inputted to the delta-sigma modulator 90 fluctuates from the maximum value to the minimum value, a ratio of the continuation time of the signal value ds2 to the continuation time of the signal value ds1 becomes larger as the value of the triangular wave TWG to be inputted becomes smaller. Hence, when the value of the triangular wave TWG takes on the minimum value, the continuation time of the signal value ds2 becomes the maximum. In addition, when the value of the triangular wave TWG takes on an intermediate value, the ratio of the continuation time of the signal ds1 to the continuation time of the signal value ds2 is 1:1.

The SSC controller 91 outputs a control signal for setting a multiplication number to the divider 92 according to the output signal DS outputted from the delta-sigma modulator 90. More specifically, the SSC controller 91 associates different multiplication numbers with binary outputs which the output signal DS of the delta-sigma modulator 90 takes on, respectively, and outputs the control signal to the divider 92 to set the multiplication number corresponding to the value of the output signal DS. The SSC controller 91 outputs a control signal to cause the divider 92 to divide the output clock signal by the multiplication number corresponding to the value of the output signal DS until the value of the output signal DS changes, i.e., only for the above continuation time of the same output as that of the delta-sigma modulator 90. Hence, when, for example, a reference clock signal RCLK is multiplied by 100, and when the spectrum is spread at the degree of modulation ±1%, the SSC controller 91 outputs a control signal to cause the divider 92 to divide the output clock signal by a multiplication number of 101 while the value of the output signal DS takes on the signal value ds1, and divide the output clock signal by a multiplication number of 99 while the value of the output signal DS takes on the signal value ds2. According to this operation, as illustrated in FIG. 25, the frequency of the output clock signal CLKOUT temporally changes as the amplitude of the triangular wave TWG makes a temporal transition.

The SSCG 9 according to the second comparative example can make a multiplication setting corresponding to a fine amplitude fluctuation of the triangular wave TWG by converting the triangular wave TWG into a compressional wave by delta-sigma modulation. Consequently, it is possible to configure the SSCG which can realize modulation control having the same accuracy as that of modulation control of the phase interpolator 81. By the way, power consumption caused by a circuit configuration which realizes the phase interpolator 81 is great, and therefore, in the case of the SSCG which uses the phase interpolator 81, it is difficult to meet a demand for lower power consumption. Hence, when a demand for lower power consumption is made, the configuration which uses the delta-sigma modulator 90 like the SSCG 9 according to the second comparative example is more suitable.

Figure 26:
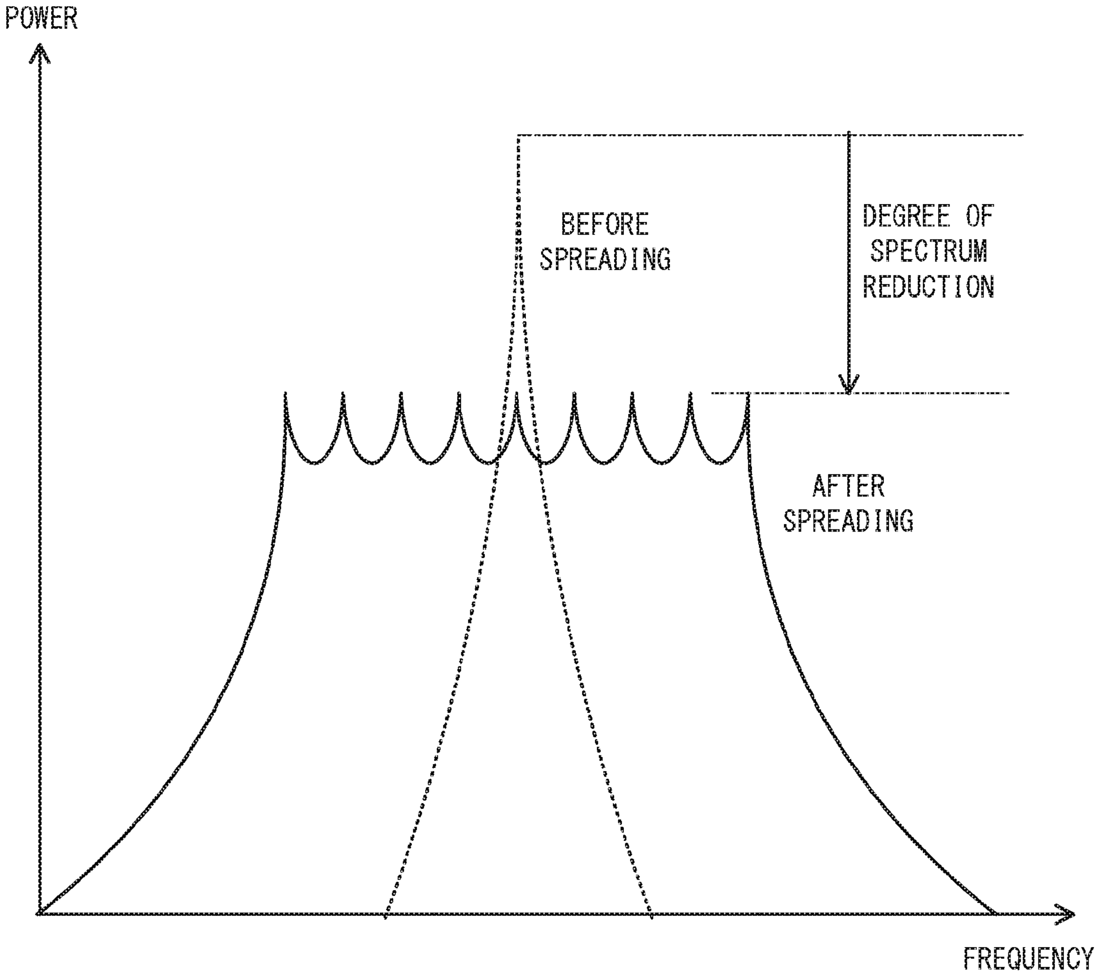
FIG. 26 illustrates a graph illustrating a frequency spectrum of an output clock signal of the SSCG according to the second comparative example.

However, in the case of the SSCG 9 which uses the delta-sigma modulator 90, the delta-sigma modulator 90 produces quantization noise which causes a spurious component, and therefore the spurious component is produced in the output clock signal CLKOUT as illustrated in FIG. 26. In addition, in FIG. 26, a solid line indicates a frequency spectrum of the output clock signal CLKOUT of the SSCG 9 according to the second comparative example, and a broken line indicates a frequency spectrum before spectrum spreading. The SSCG 9 reduces maximum power compared to before spectrum spreading. However, the SSCG 9 produces a peak which is not found from the frequency spectrum of the output clock signal CLKOUT of an SSCG 8 according to the first comparative example. Such a spurious component caused by the delta-sigma modulator 90 prevents a demand for a degree of EMI reduction from being satisfied.

Embodiments will be described below with reference to the drawings. In addition, even though the drawings are simple, technical ranges of the embodiments should not be narrowly interpreted based on these drawings. Further, the same elements will be assigned the same reference numerals, and overlapping descriptions will be omitted.

First Embodiment

FIG. 1 is a block diagram illustrating a configuration of an SSCG 1 according to the first embodiment. The SSCG 1 includes a phase comparing unit 10, a voltage-controlled oscillator 14, a triangular wave generator 15, a delta-sigma modulator 16, an SSC controller 17 and a divider 18. The SSCG 1 according to the first embodiment includes the delta-sigma modulator 16, the SSC controller 17 and the divider 18 instead of a delta-sigma modulator 90, an SSC controller 91 and a divider 92 of an SSCG 9 according to the second comparative example. In addition, in the present embodiment, the SSCG 1 includes the triangular wave generator 15. However, the SSCG 1 may not include the triangular wave generator 15, and the delta-sigma modulator 16 may be configured to receive a waveform signal from outside.

Figure 8:
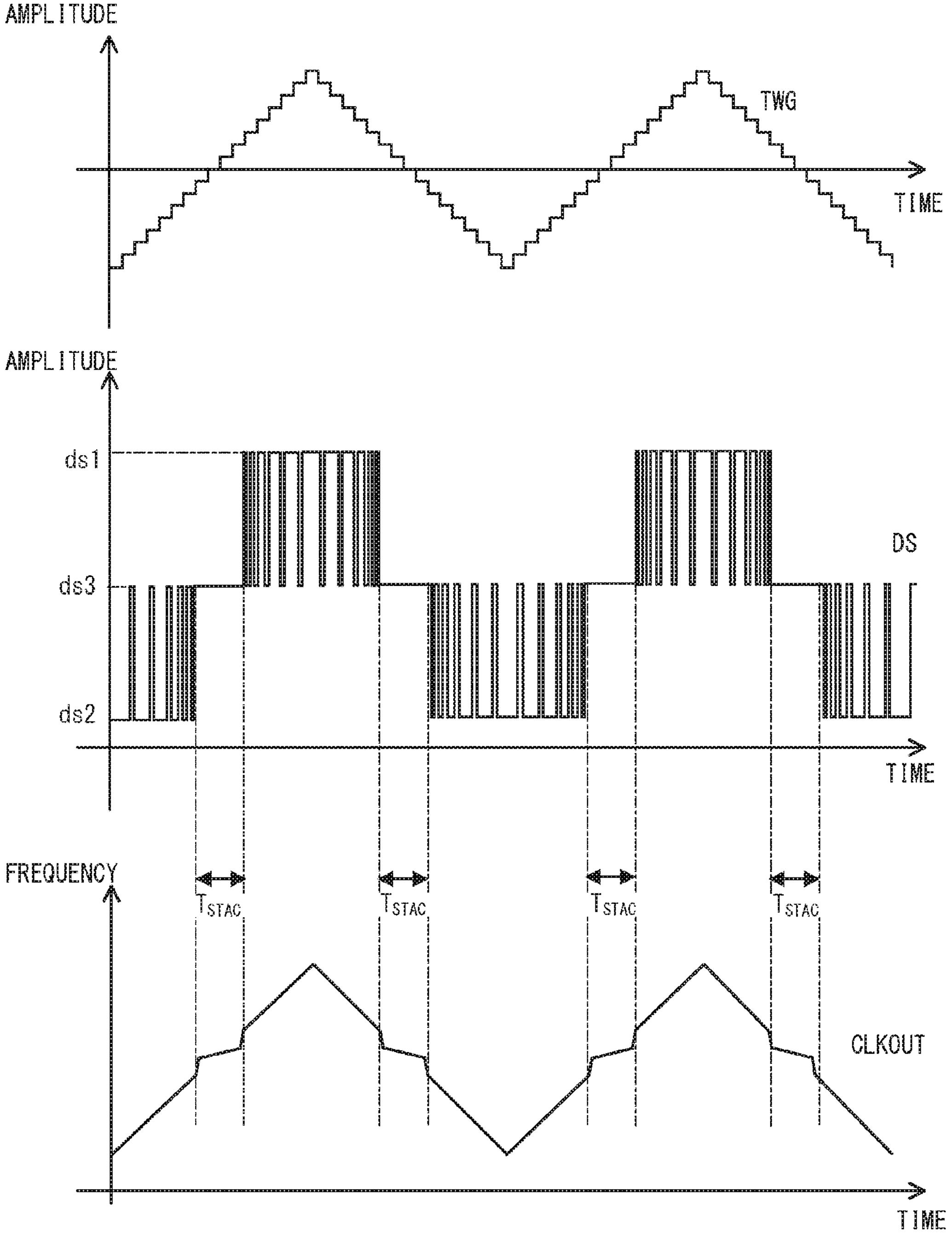
FIG. 8 illustrates graphs illustrating operation waveforms of the SSCG according to the first embodiment.

The delta-sigma modulator 16 is a first-order delta-sigma modulator which receives a triangular wave TWG which is a waveform signal generated by the triangular wave generator 15, delta-sigma modulates amplitude components of this triangular wave TWG and outputs a multibit digital value. That is, the delta-sigma modulator 16 receives a waveform signal for controlling spreading of the spectrum of an output clock signal, and outputs bits larger than 1 bit based on the received waveform signal. More specifically, in the present embodiment, the delta-sigma modulator 16 outputs a 1.5-bit digital value, i.e., ternary values as an output signal DS. Hence, as illustrated in FIG. 8 described later, the output signal DS from the delta-sigma modulator 16 fluctuates between three output values according to the triangular wave TWG.

More specifically, the output signal DS from the delta-sigma modulator 16 fluctuates as follows. In addition, it is assumed in the following description that the delta-sigma modulator 16 outputs ternary values of signal values ds1, ds2 and ds3 (see a middle graph in FIG. 8). Further, the signal values ds1 to ds3 have a relationship of ds1>ds2>ds3. When the value of the triangular wave TWG fluctuates from an intermediate value to a maximum value, the output signal DS fluctuates to alternately output binary values of ds1 and ds3. In this case, as the value of the triangular wave TWG to be inputted becomes larger, a ratio of a continuation time of the signal value ds1 to the continuation time of the signal value ds3 increases. When the value of the triangular wave TWG fluctuates from the maximum value to the intermediate value, too, the output signal DS fluctuates to alternately output the binary values of ds1 and ds3. In this regard, as the value of the triangular wave TWG to be inputted becomes smaller, the increased ratio is lowered to the original ratio.

When the value of the triangular wave TWG fluctuates from the intermediate value to the minimum value, the output signal DS fluctuates to alternately output the binary values of ds2 and ds3. In this case, as the value of the triangular wave TWG to be inputted becomes smaller, a ratio of a continuation time of the signal value ds2 to the continuation time of the signal value ds3 increases. When the value of the triangular wave TWG fluctuates from the minimum value to the intermediate value, too, the output signal DS fluctuates to alternately output the binary values of ds2 and ds3. In this case, as the value of the triangular wave TWG to be inputted becomes larger, the increased ratio is lowered to the original ratio.

Figure 2:
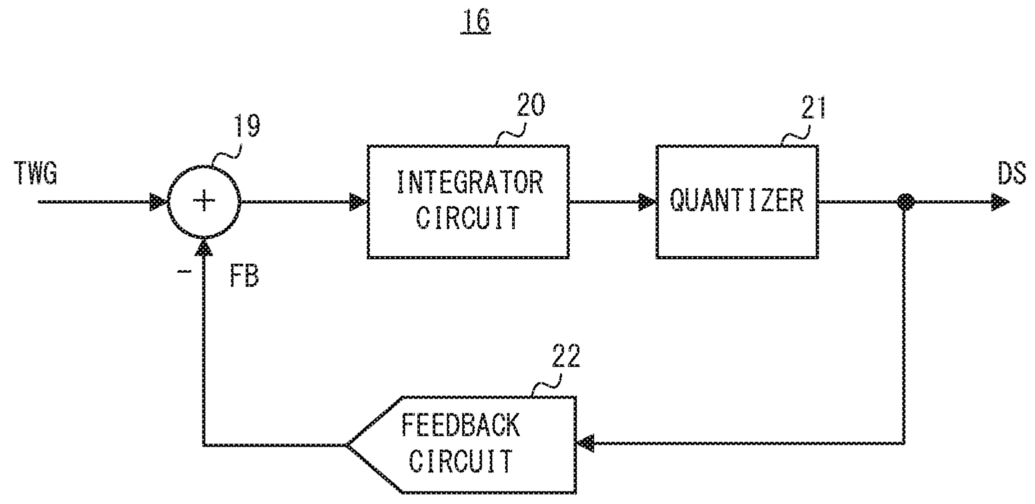
FIG. 2 is a block diagram illustrating a configuration of a delta-sigma modulator according to the first embodiment.

As illustrated in FIG. 2, the delta-sigma modulator 16 includes a subtractor circuit 19, an integrator circuit 20, a quantizer 21 and a feedback circuit 22. The subtractor circuit 19 computes a difference between the triangular wave TWG which is an input signal, and a feedback signal FB, and outputs the difference to the integrator circuit 20. The integrator circuit 20 integrates difference signals between waveform signals for controlling spreading of the spectrum of an output clock signal CLKOUT and output signals of the feedback circuit 22. More specifically, the integrator circuit 20 integrates outputs from the subtractor circuit 19, and outputs an integration result to the quantizer 21. The quantizer 21 quantizes an output signal, which is an integration value of the integrator circuit 20, to 1.5 bits, i.e., ternary values, and outputs the quantized value as the output signal DS of the delta-sigma modulator 16. The feedback circuit 22 converts the output of the quantizer 21 into a predetermined digital value. More specifically, the feedback circuit 22 receives the output signal DS from the quantizer 21, converts the output signal DS which is a 1.5-bit digital signal into a feedback signal FB having a corresponding numerical value, and supplies the feedback signal FB to the subtractor circuit 19.

The SSC controller 17 is a control circuit which controls a multiplication number according to the output signal DS of the delta-sigma modulator 16. Similar to the SSC controller 91, the SSC controller 17 outputs a control signal for setting a multiplication number to the divider 18 based on the output signal DS from the delta-sigma modulator 16. In this regard, the SSC controller 17 differs from the SSC controller 91 in associating different multiplication numbers with outputs of ternary values which the output signal DS of the delta-sigma modulator 16 takes on, respectively, and outputting a control signal to the divider 18 to set a multiplication number corresponding to a value of the output signal DS.

When, for example, a reference multiplication number is N (N is an integer), the SSC controller 17 sets one of N−1, N and N+1 as a multiplication number to the divider 18. In this case, the SSC controller 17 sets the multiplication number N+1 when the value of the output signal DS of the delta-sigma modulator 16 is a maximum value among the ternary values which the value of the output signal DS takes on. Further, the SSC controller 17 sets the multiplication number N−1 when the value of the output signal DS is a minimum value of the ternary values which the value of the output signal DS takes on. Furthermore, the SSC controller 17 sets the multiplication number N when the value of the output signal DS is a value which is not the maximum value and the minimum value of the ternary values which the value of the output signal DS takes on.

The divider 18 divides the output clock signal CLKOUT according to the multiplication number controlled by the SSC controller 17, generates a feedback clock signal VCLK and supplies the feedback clock signal VCLK to the phase comparing unit 10. Meanwhile, the divider 18 selects one of the three multiplication numbers under control of the SSC controller 17, and divides the output clock signal CLKOUT by the selected multiplication number.

Figure 3A:
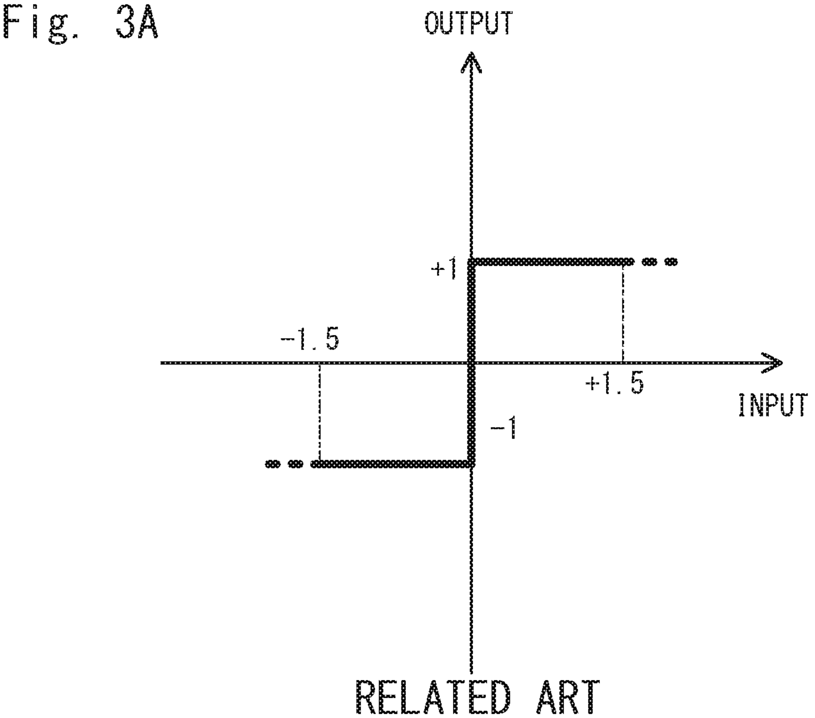
FIG. 3A illustrates a graph illustrating an example of input/output characteristics of a quantizer of a delta-sigma modulator according to a second comparative example, and illustrates a relationship between an input and an output of the quantizer.
Figure 3B:
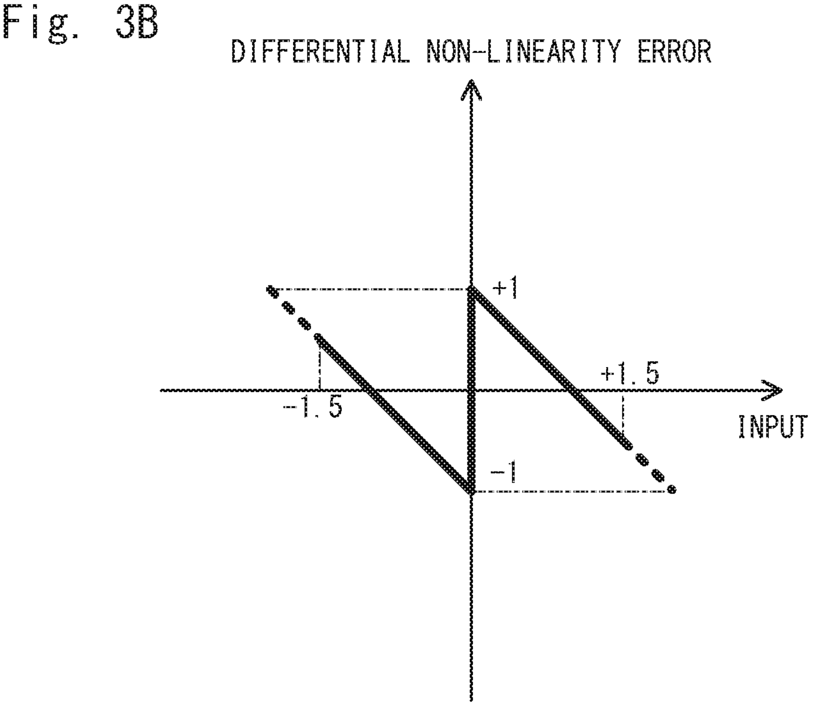
FIG. 3B illustrates a graph illustrating an example of input/output characteristics of the quantizer of the delta-sigma modulator according to the second comparative example, and illustrates a relationship between an input of the quantizer and a differential non-linearity error.
Figure 4A:
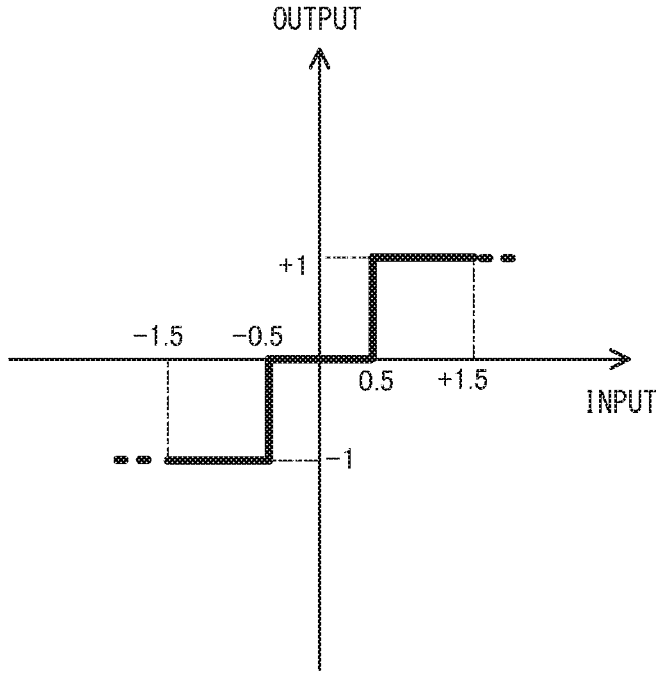
FIG. 4A illustrates a graph illustrating an example of input/output characteristics of the quantizer of the delta-sigma modulator according to the first embodiment, and illustrates a relationship between an input and an output of the quantizer.
Figure 4B:
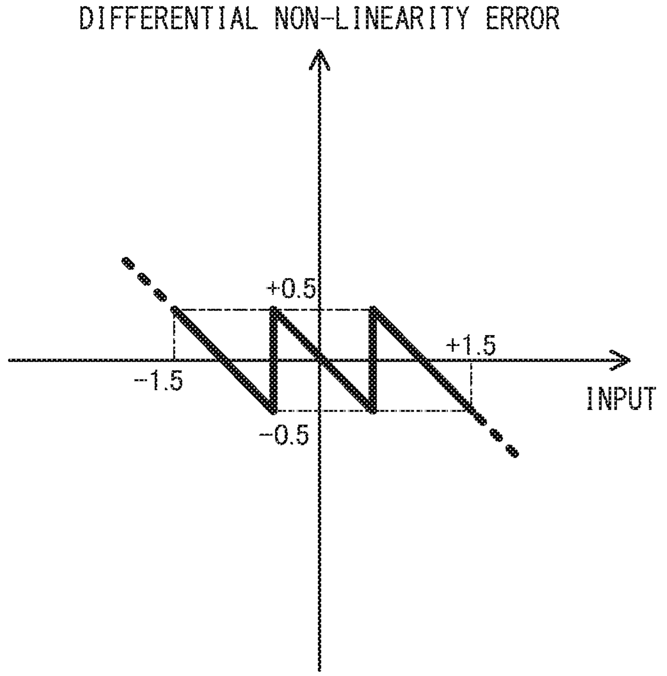
FIG. 4B illustrates a graph illustrating an example of input/output characteristics of the quantizer of the delta-sigma modulator according to the first embodiment, and illustrates a relationship between an input of the quantizer and a differential non-linearity error.

Next, a difference caused by replacing the delta-sigma modulator 90 which outputs 1 bit with the delta-sigma modulator 16 which outputs 1.5 bits will be described. FIGS. 3A and 3B show graphs illustrating examples of input/output characteristics of a quantizer (not illustrated) of the delta-sigma modulator 90 according to the second comparative example. FIG. 3A illustrates a relationship between an input and an output of the quantizer of the delta-sigma modulator 90, and FIG. 3B illustrates a relationship between an input of the quantizer of the delta-sigma modulator 90 and a differential non-linearity error. Further, FIGS. 4A and 4B show graphs illustrating examples of input/output characteristics of the quantizer 21 of the delta-sigma modulator 16 according to the present embodiment. FIG. 4A illustrates a relationship between an input and an output of the quantizer 21, and FIG. 4B illustrates a relationship between an input of the quantizer 21 and a differential non-linearity error.

As illustrated in FIG. 3A, the delta-sigma modulator 90 which outputs 1 bit uses a 1-bit quantizer, and therefore an input signal is quantized to binary values. In contrast to this, as illustrated in FIG. 4A, the delta-sigma modulator 16 according to the present embodiment uses the quantizer 21 which quantizes 1.5 bits, and therefore an input signal is quantized to ternary values. Hence, as illustrated in FIGS. 3B and 4B, the differential non-linearity error of the quantizer 21 is improved compared to that of the 1-bit quantizer. Consequently, the delta-sigma modulator 16 according to the present embodiment suppresses quantization noise compared to the delta-sigma modulator 90 which outputs 1 bit.

Hereinafter, a relationship between quantization noise of the delta-sigma modulator and a spurious component produced by the SSCG will be described.

A frequency spectrum $\sigma 1(f)$ of quantization noise produced from the quantizer of the delta-sigma modulator is generally expressed as in following equation (1). In addition, in equation (1), B represents the number of bits outputted from the quantizer.

[Mathematical 1]

$$\sigma_1(f) = \frac{1}{3} \cdot \frac{1}{(2^B - 1)^2} \quad (1)$$

Figure 5A:
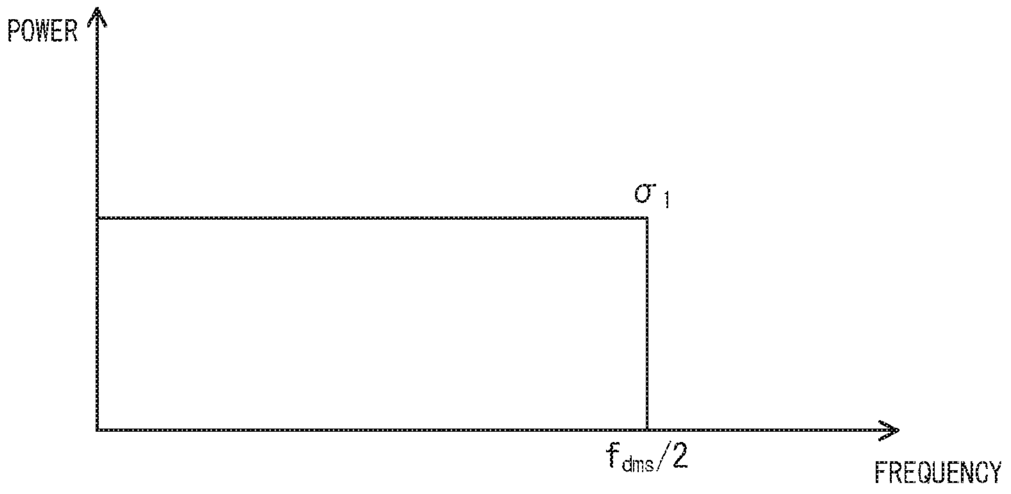
FIG. 5A illustrates a graph illustrating quantization noise of the delta-sigma modulator, and illustrates a frequency spectrum of the quantization noise before noise shaping.

FIG. 5A illustrates a graph of the equation (1). In addition, actually, there are no frequency components whose frequencies are over half of an operating frequency fdsm of the delta-sigma modulator, and therefore noise is not observed from the frequency equal to or more than fdsm/2 as illustrated in FIG. 5A.

In this regard, an equation for the frequency spectrum of quantization noise is generally deformed to following equation (2) to observe noise from an output of the delta-sigma modulator since the noise is influenced by a noise shaping effect. In addition, $\sigma 2(f)$ represents the frequency spectrum of quantization noise after noise shaping.

[Mathematical 2]

$$\sigma_2(f) = \left(2\sin\pi\frac{f}{f_{dsm}}\right)^2 \cdot \frac{1}{3} \cdot \frac{1}{(2^B - 1)^2} \quad (2)$$

Figure 5B:
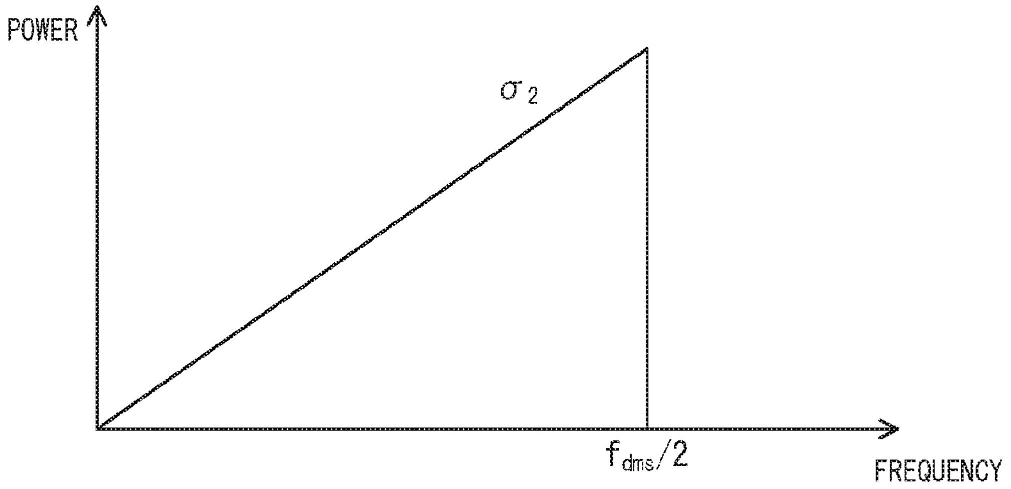
FIG. 5B illustrates a graph illustrating quantization noise of the delta-sigma modulator, and illustrates a frequency spectrum of the quantization noise after noise shaping.
Figure 5C:
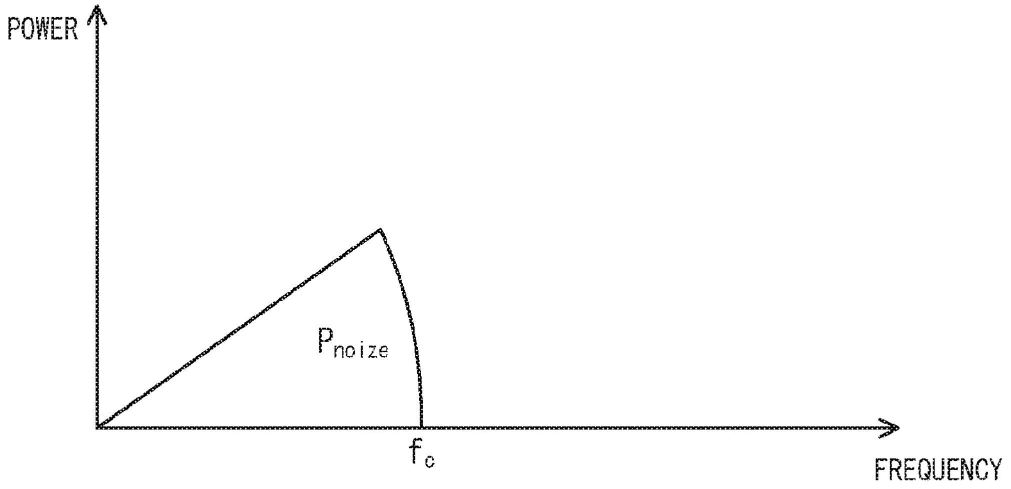
FIG. 5C illustrates a graph illustrating quantization noise of the delta-sigma modulator, and illustrates a frequency spectrum of the quantization noise whose high frequency components have been cut.

FIG. 5B illustrates a graph of equation (2). Further, high frequency components of this noise are cut by a loop filter 13 of the SSCG, and therefore a total amount Pnoise of quantization noise observed from the output clock signal CLKOUT is expressed as in following equation (3). In addition, a filter band fc described below refers to a cutoff frequency of the loop filter 13. FIG. 5C illustrates a graph of equation (3).

[Mathematical 3]

$$P_{noise} = \int_{-f_c}^{+f_c} \left(2\sin\pi\frac{f}{f_{dsm}}\right)^2 \cdot \frac{1}{3} \cdot \frac{1}{(2^B - 1)^2} \cdot df \approx \frac{8 \cdot \pi^2}{9} \cdot \left(\frac{f_c}{f_{dsm}}\right)^3 \cdot \frac{1}{(2^B - 1)^2} \quad (3)$$

Equation (3) shows that sufficiently lowering the filter band fc compared to the operating frequency fdsm of the delta-sigma modulation is effective for reducing leakage of quantization noise observed from the output clock signal CLKOUT. Conventionally, it has been possible to sufficiently reduce a ratio of the filter band fc to the operating frequency fdsm, and therefore it has been possible to prevent production of a spurious component caused by quantization noise. However, miniaturization of a semiconductor process tends to deteriorate characteristics of analog elements, and a demand for a more highly versatile semiconductor IP (Intellectual Property) makes it difficult to manage the filter band fc at an arbitrary value. As a result, quantization noise of the delta-sigma modulator leaks to an output without being sufficiently suppressed and then a spurious component is produced, and therefore it is difficult to satisfy a specification for the degree of EMI reduction.

However, the delta-sigma modulator 16 according to the present embodiment uses the quantizer 21 which quantizes 1.5 bits, and therefore a differential non-linearity error of the quantizer 21 is improved compared to the 1-bit quantizer as described above. Hence, the delta-sigma modulator 16 according to the present embodiment suppresses quantization noise compared to the delta-sigma modulator 90 which outputs 1 bit. When this effect is calculated according to equation (3), the effect shows that the SSCG 1 according to the present embodiment can improve quantization noise components produced by the delta-sigma modulator by 5.2 dB compared to an SSCG 9 according to the second comparative example. This means that a tolerance of a filter band demanded by the specification for the degree of EMI reduction can be increased about 1.5 times. That is, this means that quantization noise of the SSCG 9 including the filter band fc and quantization noise of the SSCG 1 including a filter band fc' (fc'=1.5×fc) are the same.

Consequently, it is possible to prevent influences of deterioration of analog element characteristics caused by miniaturization of a semiconductor process, and prevent an influence of an increase in the filter band fc caused by a demand for a more versatile specification by outputting 1.5 bits from the delta-sigma modulator. Consequently, it is possible to prevent production of a spurious component caused by quantization noise.

By the way, as described above, the divider 18 divides an output clock signal by switching between the multiplication numbers of N−1, N and N+1 under control of the SSC controller 17. In this case, the SSCG 1 can spread the spectrum at the same degree of modulation as that of the SSCG 9 according to the second comparative example which includes the divider 92 which divides an output clock signal by switching between the multiplication numbers of N−1, N and N+1. Thus, by adding the multiplication number between the two multiplication numbers of the divider 92 of the SSCG 9 according to the second comparative example to the divider 18 of the SSCG 1, it is possible to spread the spectrum at the same degree of modulation as that of the SSCG 9.

In this regard, when, for example, the divider of the SSCG 9 according to the second comparative example divides an output clock signal by switching between the multiplication numbers of N and N+1, only the following divider 18 needs to be used to realize the SSCG 1 which spreads the spectrum at the same degree of modulation as that of the SSCG 9. That is, the divider 18 only needs to be configured to divide an output clock signal by switching between the multiplication numbers of N, N+0.5 and N+1. The multiplication numbers used by the divider 18 to divide an output clock signal are all preferably integers such as N−1, N and N+1 from a view point of simplification of a circuit configuration and power saving. However, the multiplication numbers may take on values which are integer multiples of 0.5 such as N, N+0.5 and N+1. This is because, although a divider which realizes 0.5 multiplication is necessary, it is relatively easy to realize 0.5 multiplication by using a positive edge and a negative edge of the output clock signal CLKOUT without using a phase interpolator. Thus, even when the delta-sigma modulator 16 which outputs 1.5 bits (ternary values) is used, it is possible to configure the SSCG without using a phase interpolator. Consequently, it is possible to reduce the amount of produced quantization noise while suppressing power consumption. Consequently, it is possible to realize the SSCG which prevents production of an unnecessary spurious component without decreasing the filter band fc. In addition, the SSCG 1 may be configured to cause the divider 18 to divide an output clock signal by a multiplication number which is a decimal number other than 0.5.

Figure 6:
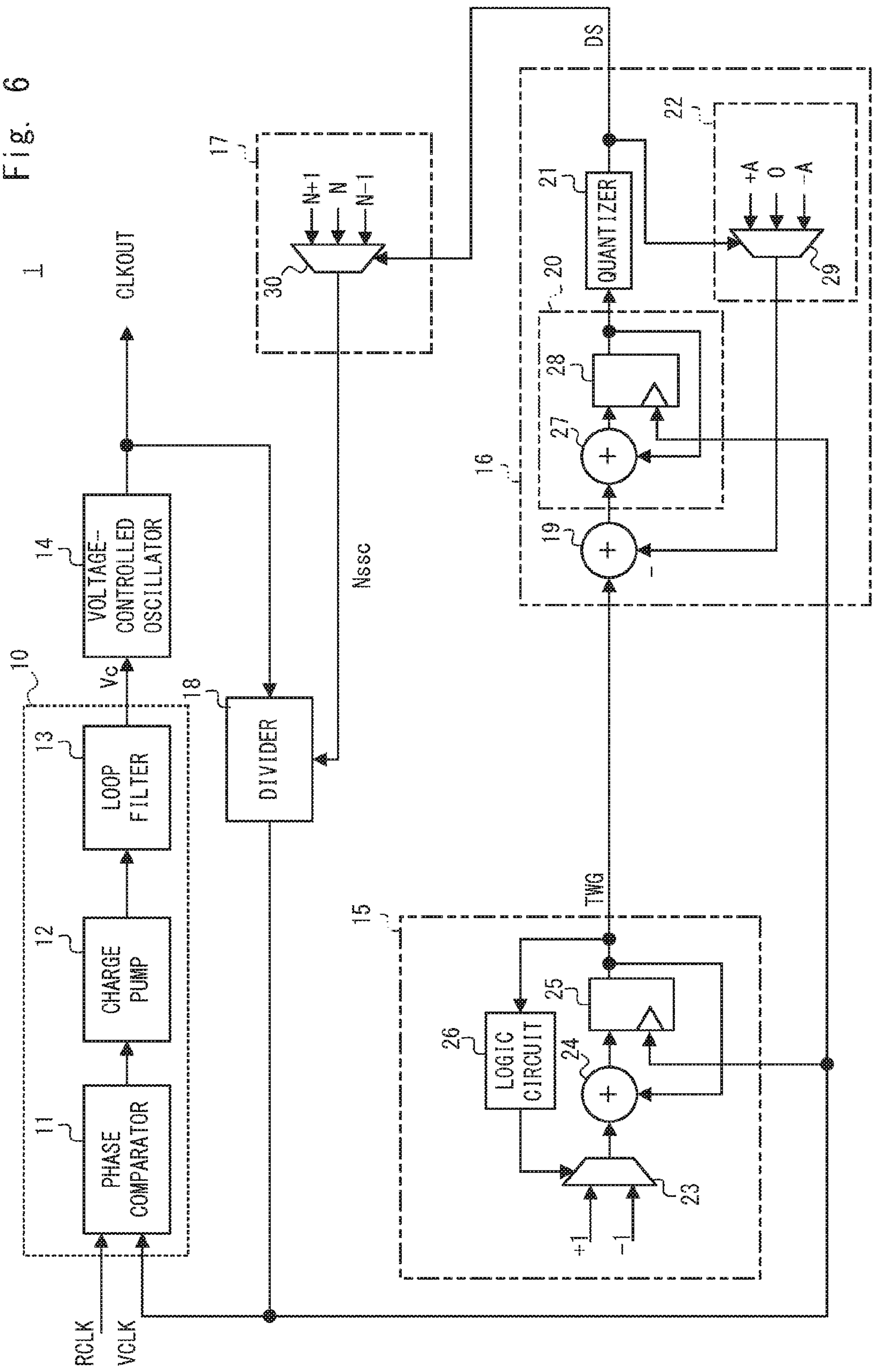
FIG. 6 is a circuit diagram illustrating an example of a circuit configuration of the SSCG according to the first embodiment.

The SSCG 1 according to the first embodiment has been described above. Lastly, a specific example of the circuit configuration which realizes the SSCG 1 will be described. FIG. 6 is a circuit diagram illustrating an example of the circuit configuration of the SSCG 1. In addition, FIG. 6 illustrates an example of a specific circuit configuration including the triangular wave generator 15, the delta-sigma modulator 16 and the SSC controller 17 for simplification of description.

As illustrated in FIG. 6, the triangular wave generator 15 includes a selector 23, an adder circuit 24, a counter 25 and a logic circuit 26. The selector 23 selects and outputs one of +1 and −1 according to a signal from the logic circuit 26. The adder circuit 24 adds the output from the selector 23 and an output from the counter 25. The counter 25 counts outputs from the adder circuit 24 in synchronization with the feedback signal VCLK. When an output value from the counter 25 reaches a predetermined value, i.e., a maximum value or a minimum value of the amplitude of the triangular wave TWG, the logic circuit 26 performs control to switch the output of the selector 23. According to this configuration, the triangular wave generator 15 generates the triangular wave TWG of an arbitrary frequency.

Further, the delta-sigma modulator 16 includes the subtractor circuit 19, the integrator circuit 20, the quantizer 21 and the feedback circuit 22 as described above. As illustrated in FIG. 6, the integrator circuit 20 includes an adder circuit 27 and an integrator 28, and integrates outputs from the subtractor circuit 19. Further, as illustrated in FIG. 6, the feedback circuit 22 includes a selector 29, and selects and outputs one of +A, 0 and −A which are digital signal values according to an output from the quantizer 21. In addition, A represents a feedback coefficient value of the feedback circuit 22.

Further, the SSC controller 17 includes a selector 30, and selects one of the multiplication numbers N+1, N and N−1 according to an output from the delta-sigma modulator 16, and outputs a control signal Nssc to the divider 18. According to this configuration, the SSC controller 17 switches a multiplication setting of the divider 18 according to the 1.5-bit output signal DS from the delta-sigma modulator 16.

Next, a task of the SSCG 1 according to the first embodiment will be described.

As described above, the SSCG 1 according to the first embodiment more effectively prevents production of a spurious component than the SSCG 9 according to the second comparative example does. However, the inventors have found that adopting a delta-sigma modulator which outputs multibits produces a new spurious component of other components.

Figure 7:
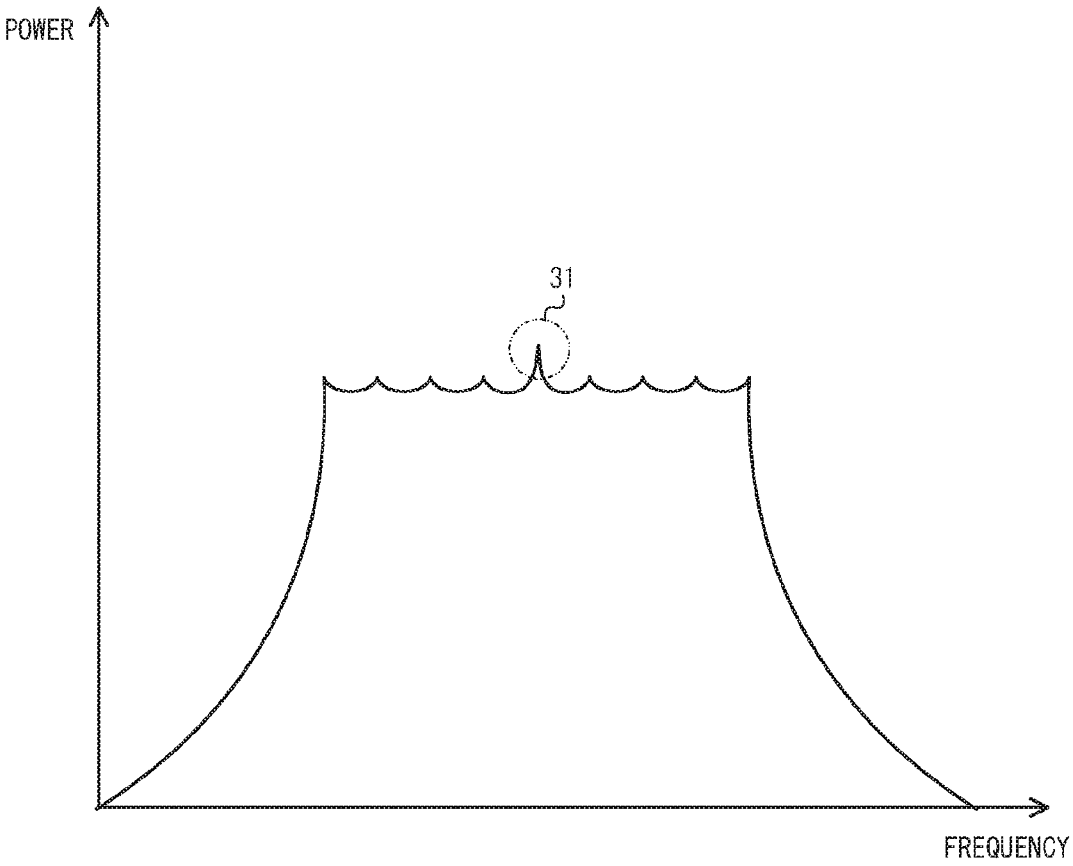
FIG. 7 illustrates a graph illustrating a frequency spectrum of an output clock signal of the SSCG according to the first embodiment.

FIG. 7 illustrates a graph illustrating a frequency spectrum of the output clock signal CLKOUT of the SSCG 1 according to the first embodiment. As illustrated in FIG. 7, the SSCG 1 according to the first embodiment more effectively prevents production of a spurious component than the frequency spectrum of the SSCG 9 according to the second comparative example illustrated in FIG. 26 does. However, a spurious component 31 caused by the delta-sigma modulator 16 which is configured to output multibits is produced in the output clock signal CLKOUT of the SSCG 1. This spurious component 31 is produced only in frequency components at one portion in the case of the delta-sigma modulator 16 which outputs 1.5 bits (ternary values), and limits the degree of EMI reduction. This spurious component 31 is produced at a corresponding frequency when the triangular wave TWG inputted to the delta-sigma modulator 16 becomes close to an output signal of the feedback circuit 22. The delta-sigma modulator 16 integrates differences between signals input to the delta-sigma modulator 16 and signals of the feedback circuit 22, and, when the integration value exceeds a threshold of the quantizer 21, an output value changes. Hence, when the signal input to the delta-sigma modulator 16 becomes close to the output signal of the feedback circuit 22, the above difference becomes smaller and an integration time which the integration value takes to exceed the threshold becomes longer. Hence, the output of the delta-sigma modulator 16 stagnates at a fixed value for a long period of time.

FIG. 8 shows graphs illustrating operation waveforms of the SSCG 1 according to the first embodiment. In addition, in FIG. 8, the upper graph illustrates a temporal transition of the amplitude of the triangular wave TWG generated by the triangular wave generator 15, the middle graph illustrates a temporal transition of the output signal DS of the delta-sigma modulator 16 and the lower graph illustrates a temporal transition of the frequency of the output clock signal CLKOUT. As illustrated in FIG. 8, an output of the output signal DS stagnates at a fixed value during a period TSTAC. When this period TSTAC goes below the filter band fc of the SSCG 1, the stagnation of the output signal DS is reflected in the output clock signal CLKOUT. That is, when (time duration of period TSTAC)>1/(filter band fc) holds, the stagnation of the output signal DS is reflected in the output clock signal CLKOUT. Hence, as illustrated in FIG. 8, during the period TSTAC, the frequency of the output clock signal CLKOUT also fluctuates little compared to the fluctuation during other periods, and stagnates. Therefore, a spurious component is produced in the output clock signal CLKOUT. SSCGs which reduce this spurious component will be described in the second and third embodiments.

Second Embodiment

Figure 9:
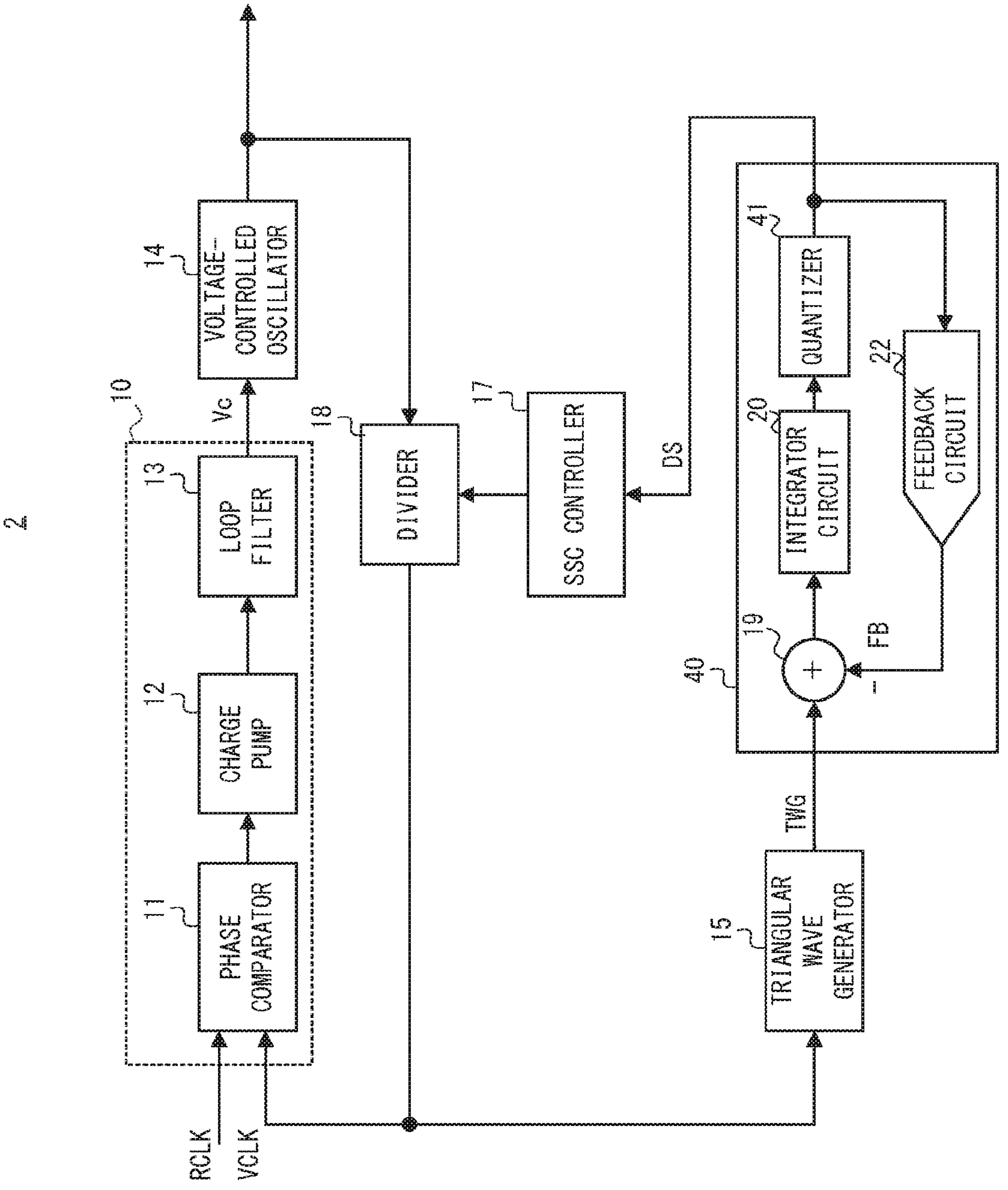
FIG. 9 is a block diagram illustrating a configuration of an SSCG according to a second embodiment.

FIG. 9 is a block diagram illustrating a configuration of an SSCG 2 according to the second embodiment. The SSCG 2 employs the same configuration as that of an SSCG 1 illustrated in FIG. 1 except that a delta-sigma modulator 16 is replaced with a delta-sigma modulator 40. Further, the delta-sigma modulator 40 employs the same configuration as that of the delta-sigma modulator 16 of the SSCG 1 illustrated in FIG. 2 except that a quantizer 21 is replaced with a quantizer 41. The quantizer 41 differs from the quantizer 21 only in how to set a quantization threshold interval.

Figure 10A:
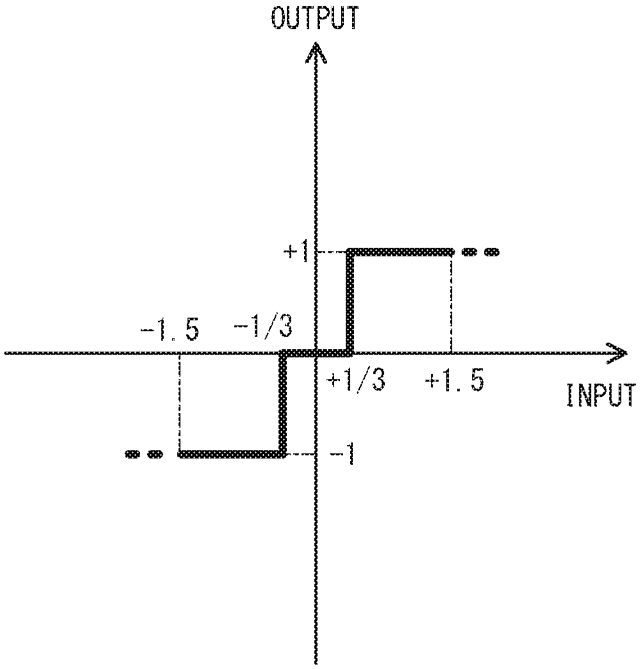
FIG. 10A illustrates a graph illustrating an example of input/output characteristics of a quantizer according to the second embodiment, and illustrates a relationship between an input and an output of the quantizer.
Figure 10B:
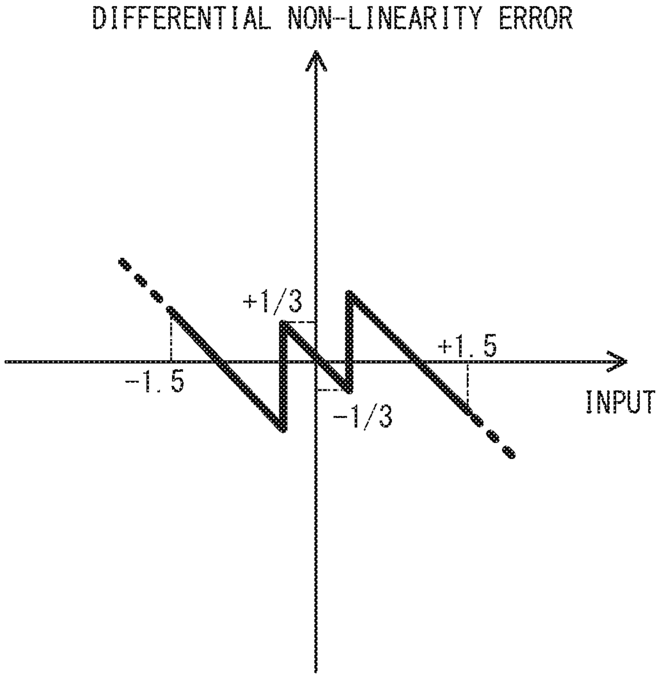
FIG. 10B illustrates a graph illustrating an example of input/output characteristics of the quantizer according to the second embodiment, and illustrates a relationship between an input of the quantizer and a differential non-linearity error.

A difference between a quantization threshold interval of the quantizer 21 and a quantization threshold interval of the quantizer 41 will be described with reference to FIGS. 4A, 4B, 10A and 10B. In addition, FIGS. 10A and 10B show graphs illustrating examples of input/output characteristics of the quantizer 41. FIG. 10A illustrates a relationship between an input and an output of the quantizer 41, and FIG. 10B illustrates a relationship between the input of the quantizer 41 and a differential non-linearity error.

As illustrated in FIG. 4A, the quantization threshold has been set to {−0.5, +0.5}, and the quantizer 21 has outputted ternary values of {−1, 0, +1}. In contrast to this, the quantization threshold is set to {−⅓, +⅓}, and the quantizer 41 according to the present embodiment outputs ternary values of {−1, 0, +1} similar to those of the quantizer 21. A difference between settings of these threshold intervals will be further described. As illustrated in FIG. 4A, the quantizer 21 outputs 0 only when an input is −0.5 (threshold) to 0.5 (threshold). In this regard, the quantizer 21 outputs one of −1, 0 and 1 according to the input, and the quantization interval is 1. The threshold interval between −0.5 and 0.5 is also 1, and therefore the threshold interval is the same as the quantization interval. In contrast to this, as illustrated in FIG. 10A, the quantizer 41 outputs 0 when the input is −⅓ (threshold) to ⅓ (threshold), and outputs −1 or 1 when the input takes on other values. The threshold interval between −⅓ and ⅓ is ⅔, and therefore the threshold interval is set to less than the quantization interval. Thus, in the quantizer 41 according to the present embodiment, at least one of the quantization threshold intervals is set to the threshold interval less than the quantization interval. That is, the quantization threshold interval of the quantizer 41 includes the threshold interval less than the quantization interval. In the present embodiment, the threshold interval other than the threshold interval corresponding to a maximum output value and a threshold interval corresponding to a minimum output value among the threshold intervals set to the quantizer 41 is set to the threshold interval less than the quantization interval.

As illustrated in FIG. 4B, when the threshold interval corresponding to output value:0 is 1, a differential non-linearity error corresponding to output value:0 is ±0.5. In contrast to this, as illustrated in FIG. 10B, when the threshold interval corresponding to output value:0 is ⅔, a differential non-linearity error corresponding to output value:0 is ±⅓. The above stagnation of an output signal DS is improved by reducing an integration amount required until an output of the quantizer of the delta-sigma modulator is switched, i.e., by reducing a differential non-linearity error. Hence, when the threshold settings illustrated in FIGS. 10A and 10B are made, the stagnation of the output signal DS of the delta-sigma modulator becomes short compared to when the threshold settings illustrated in FIGS. 4A and 4B are made. A more specific example will be described with reference to FIGS. 11 and 12.

Figure 11:
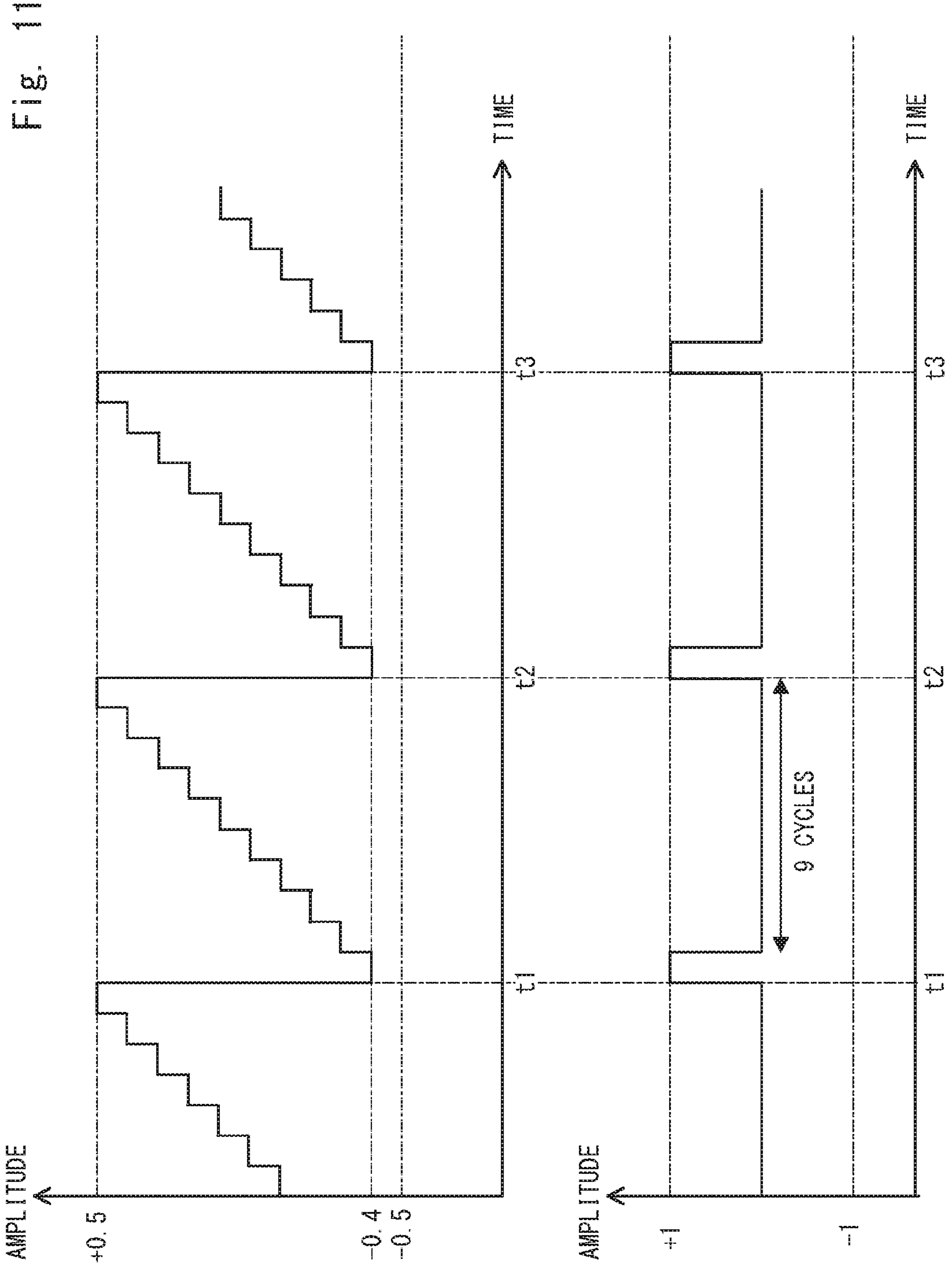
FIG. 11 illustrates graphs illustrating examples of operation waveforms of the delta-sigma modulator according to the first embodiment.
Figure 12:
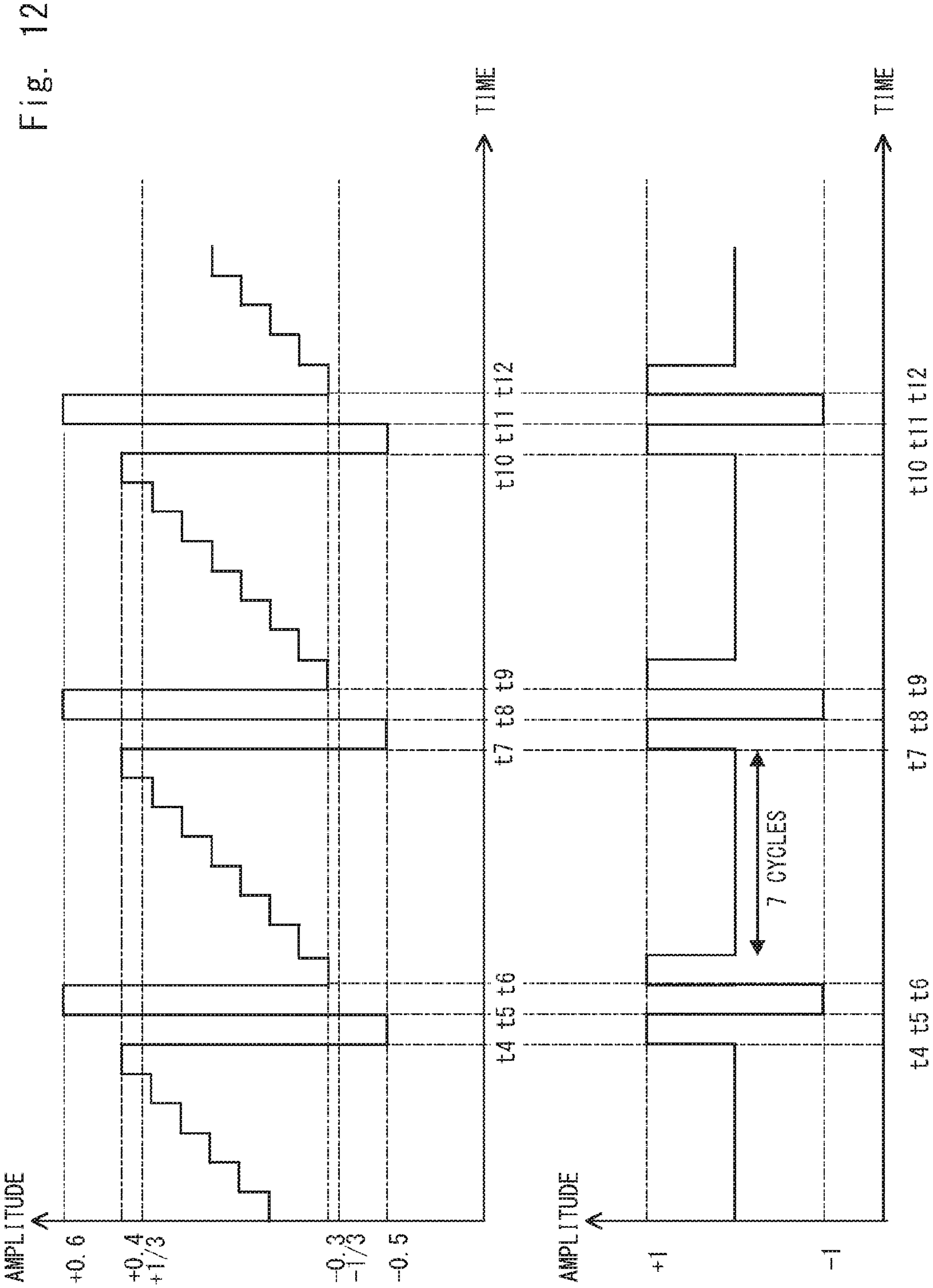
FIG. 12 illustrates graphs illustrating examples of operation waveforms of a delta-sigma modulator according to the second embodiment.

FIG. 11 shows graphs illustrating examples of operation waveforms of the delta-sigma modulator 16 according to the first embodiment. Further, FIG. 12 illustrates graphs illustrating examples of operation waveforms of the delta-sigma modulator 40 according to the present embodiment. The upper graphs in FIGS. 11 and 12 illustrate temporal transitions of input signals to the quantizer 21 and the quantizer 41, respectively. That is, the upper graphs illustrate the temporal transitions of outputs from an integrator circuit 20. Further, the lower graphs in FIGS. 11 and 12 illustrate temporal transitions of outputs of the quantizer 21 and the quantizer 41, respectively. In addition, in an example illustrated in FIG. 11, the quantization threshold of the quantizer 21 is set to {−0.5, +0.5}, and the threshold interval corresponding to output value:0 of the quantizer 21 is 1. Further, in an example illustrated in FIG. 12, the quantization threshold of the quantizer 41 is set to {−⅓, +⅓}, and the threshold interval corresponding to output value:0 of the quantizer 41 is ⅔.

Furthermore, in this description, an output value of a feedback circuit 22 takes on one of −1, 0 and 1. That is, the feedback circuit 22 outputs 1 as a maximum value of the output signal, outputs 1 as a minimum value of the output signal and outputs 0 as an output signal between these maximum and minimum values. The feedback circuit 22 outputs 1 when the output of the quantizer 21 or the quantizer 41 is 1, outputs −1 when the output of the quantizer 21 or the quantizer 41 is −1, and outputs 0 when the output of the quantizer 21 or the quantizer 41 is 0.

Further, a case where an input to the delta-sigma modulator 16 or the delta-sigma modulator 40 is close to 0 will be described as an example. More specifically, an input value to the delta-sigma modulator 16 or the delta-sigma modulator 40 is 0.1. In addition, a triangular wave TWG is used for the input to the delta-sigma modulator 16 or the delta-sigma modulator 40, and, even though, precisely speaking, an input value slightly fluctuates as the time passes, the input value is 0.1 irrespectively of the passage of time.

An operation of the quantizer 21 illustrated in FIG. 11 will be described first based on the above. The quantizer 21 outputs 0 until an integration value of the integrator circuit 20 reaches 0.5 (threshold). Hence, the feedback circuit 22 outputs 0 until the integration value of the integrator circuit 20 reaches 0.5 (threshold). The input value to the delta-sigma modulator 16 is 0.1, and therefore the difference between the input value to the delta-sigma modulator 16 and the output of the feedback circuit 22 is 0.1 until the integration value of the integrator circuit 20 reaches 0.5 (threshold). Hence, the output of the integrator circuit 20 increases by 0.1 every time. Further, when the output of the integrator circuit 20 is 0.5 and reaches the threshold of the quantizer 21, the quantizer 21 outputs 1 only once (see times t1, t2 and t3 in FIG. 11). Thus, the feedback circuit 22 also outputs 1, and therefore the difference between the input value to the delta-sigma modulator 16 and the output of the feedback circuit 22 is −0.9 and the output of the integrator circuit 20 is lowered to −0.4. Hence, the output of the quantizer 21 returns to 0 again.

Subsequently, the delta-sigma modulator 16 repeats the same operation. In this case, an interval in which the quantizer 21 outputs 1 is 9 cycles as illustrated in FIG. 11. These 9 cycles correspond to a period TSTAC in which the output signal DS stagnates.

Next, the operation of the quantizer 41 illustrated in FIG. 12 will be described. The quantizer 41 outputs 0 until the integration value of the integrator circuit 20 reaches ⅓ (threshold). Hence, the feedback circuit 22 outputs 0 until the integration value of the integrator circuit 20 reaches ⅓ (threshold). The input value to the delta-sigma modulator 40 is 0.1, and therefore the difference between the input value to the delta-sigma modulator 40 and the output of the feedback circuit 22 is 0.1 until the integration value of the integrator circuit 20 reaches ⅓ (threshold). Hence, the output of the integrator circuit 20 increases by 0.1 every time. Further, when the output of the integrator circuit 20 becomes 0.4 and reaches ⅓ which is the threshold of the quantizer 41, the quantizer 41 outputs 1 only once (see times t4, t7 and t10 in FIG. 12). Thus, the feedback circuit 22 also outputs 1, and therefore the difference between the input value to the delta-sigma modulator 40 and the output of the feedback circuit 22 becomes −0.9 and the output of the integrator circuit 20 is lowered to −0.5. Hence, the output of the integrator circuit 20 reaches −⅓, which is the threshold of the quantizer 41, and the quantizer 41 outputs −1 only once (see times t5, t8 and t11 in FIG. 12). Thus, the feedback circuit 22 also outputs −1, and therefore the difference between the value input to the delta-sigma modulator 40 and the output of the feedback circuit 22 becomes 1.1, and the output of the integrator circuit 20 rises to 0.6. Hence, the output of the integrator circuit 20 again reaches ⅓, which is the threshold of the quantizer 41, and the quantizer 41 outputs 1 only once (see times t6, t9 and t12 in FIG. 12). Then, the feedback circuit 22 also outputs 1, and therefore the difference between the value input to the delta-sigma modulator 40 and the output of the feedback circuit 22 becomes −0.9 and the output of the integrator circuit 20 is lowered to 0.3.

Subsequently, the delta-sigma modulator 40 repeats the same operation. In this case, an interval which the quantizer 41 takes to output 1, −1 and 1 again after outputting 1, −1 and 1 is 7 cycles as illustrated in FIG. 12. These 7 cycles correspond to the period TSTAC in which the output signal DS stagnates.

Thus, by reducing to ⅔ the integration amount which is required until the output of the quantizer 41 is switched, for an input whose difference from the output of the feedback circuit 22 is small and which is close to 0, it is possible to shorten a stagnation period of the period TSTAC to about ⅔ (7 cycles/9 cycles). When the stagnation time is shortened to ⅔, it is possible to reduce spurious components by about 3.5 dB (≈20 log (⅔)).

Figure 13:
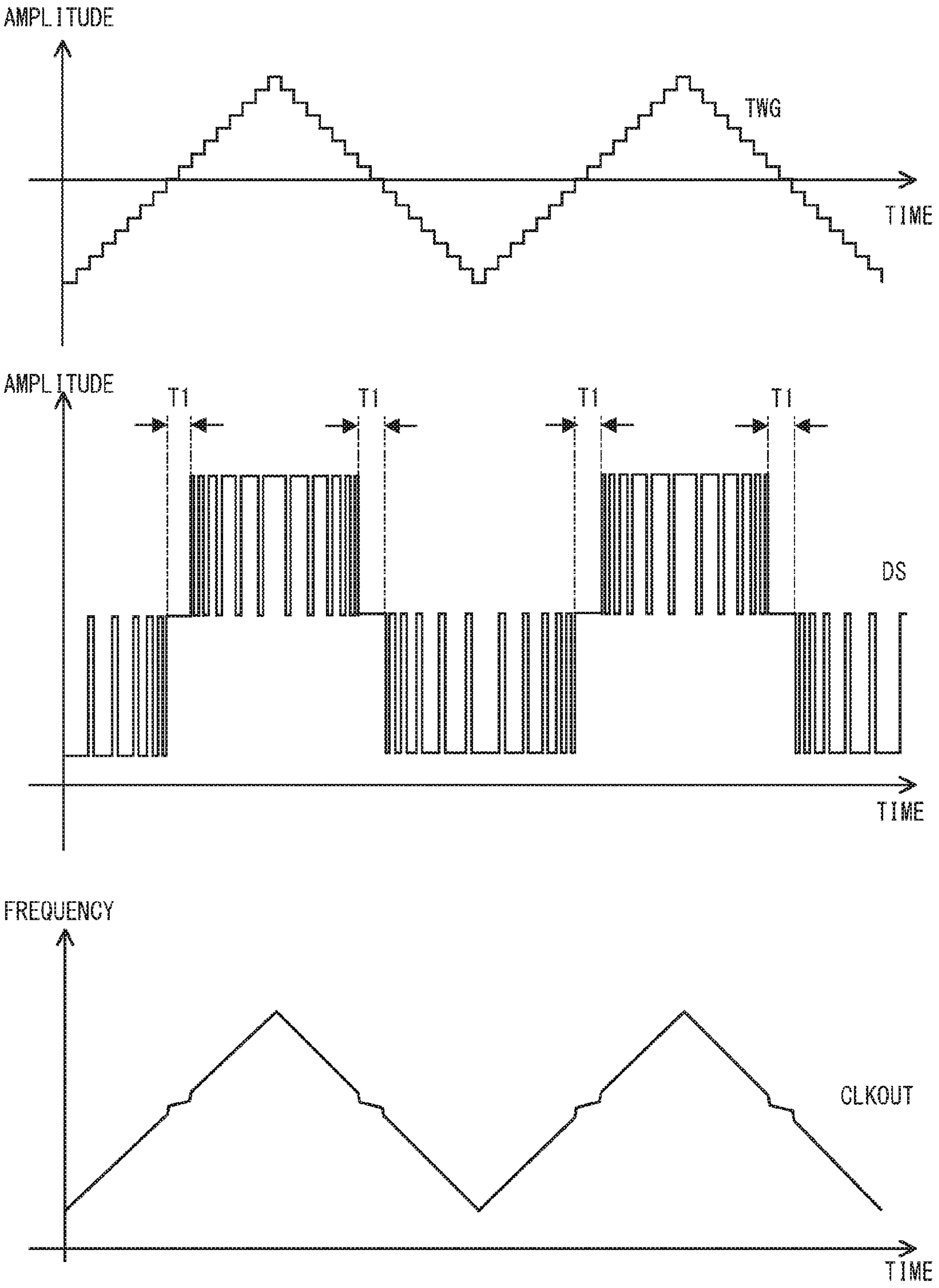
FIG. 13 illustrates graphs illustrating operation waveforms of the SSCG according to the second embodiment.
Figure 14:
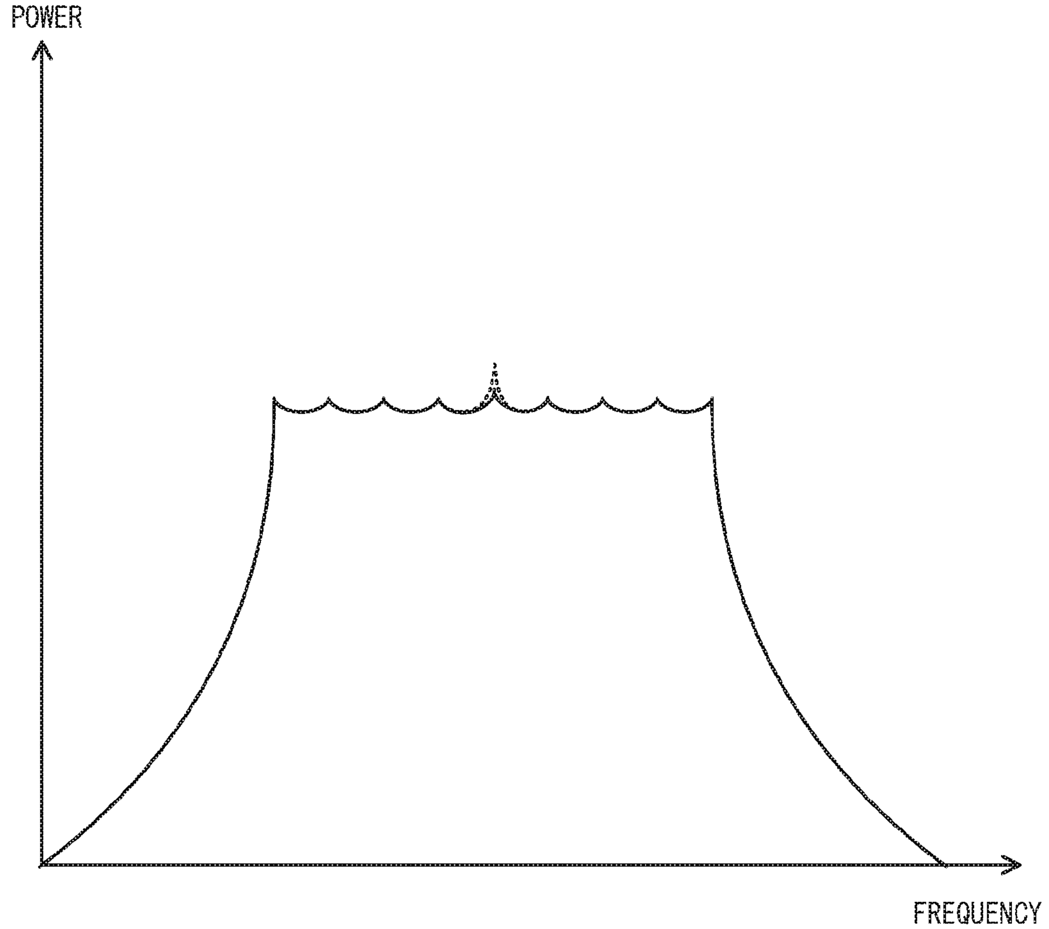
FIG. 14 illustrates a graph illustrating a frequency spectrum of an output clock signal of the SSCG according to the second embodiment.

FIG. 13 shows graphs illustrating operation waveforms of the SSCG 2 according to the second embodiment. In addition, the upper graph illustrates a temporal transition of the amplitude of the triangular wave TWG generated by the triangular wave generator 15, the middle graph illustrates a temporal transition of the output signal DS of the delta-sigma modulator 40, and the lower graph illustrates a temporal transition of the frequency of an output clock signal CLKOUT. As described above, the threshold interval less than the quantization interval is set in the quantizer 41, and therefore a time duration of a period T1 in which the output signal DS stagnates is shorter than a time duration of the period TSTAC in which the output signal DS of the SSCG 1 according to the first embodiment stagnates. Hence, the stagnation time of the frequency of the output clock signal CLKOUT is also shorter than that of the SSCG 1 according to the first embodiment. Consequently, as illustrated in FIG. 14, the spurious component is reduced compared to the SSCG 1 according to the first embodiment. In addition, in FIG. 14, the solid line indicates the frequency spectrum of the output clock signal CLKOUT of the SSCG 2 according to the second embodiment, and the broken line indicates the frequency spectrum of the output clock signal CLKOUT of the SSCG 1 according to the first embodiment.

The SSCG 2 according to the second embodiment has been described. In addition, the SSCG 2 differs from the SSCG 1 only in that the threshold interval of the quantizer 41 is changed, and therefore is realized by the same circuit configuration as the circuit configuration of the SSCG 1 illustrated in FIG. 6.

Third Embodiment

In the second embodiment, an output signal DS of a delta-sigma modulator is prevented from stagnating at a fixed value by decreasing an integration amount which is required until an output of a quantizer of the delta-sigma modulator changes. In the third embodiment, another method is adopted to prevent the output signal DS of the delta-sigma modulator from stagnating at a fixed value. The output signal DS of the delta-sigma modulator stagnates at a fixed value because a difference between an input to the delta-sigma modulator and an output of a feedback circuit 22 is small. Hence, in the third embodiment, a waveform of a triangular wave TWG to be inputted to the delta-sigma modulator is shaped in advance to prevent the difference between the input to the delta-sigma modulator and the output of the feedback circuit 22 from settling in a predetermined range.

Figure 15:
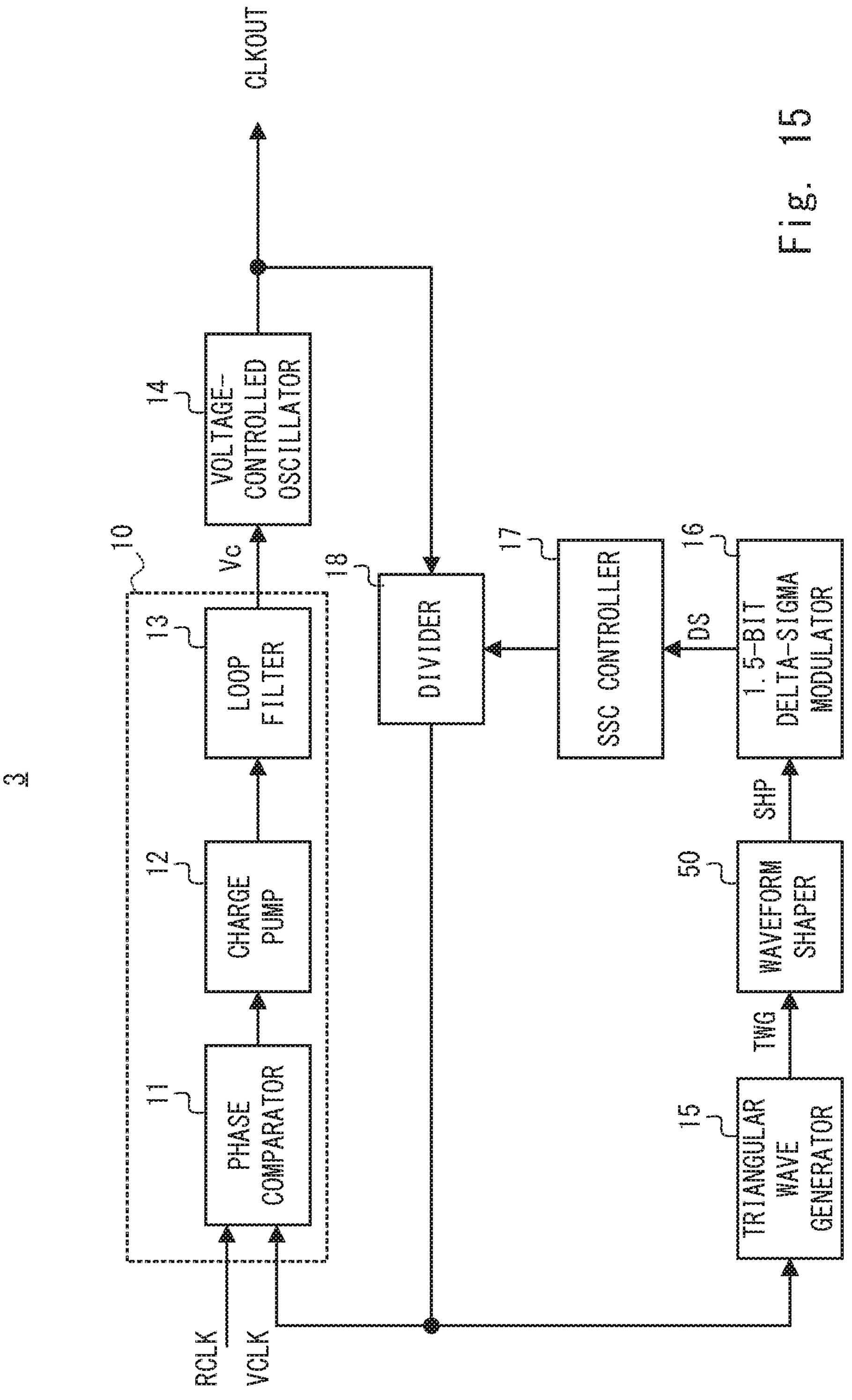
FIG. 15 is a block diagram illustrating a configuration of an SSCG according to a third embodiment.

FIG. 15 is a block diagram illustrating a configuration of an SSCG 3 according to the third embodiment. The SSCG 3 employs the same configuration as that of an SSCG 1 illustrated in FIG. 1 except that a waveform shaper 50 is added. The waveform shaper 50 is added between a triangular wave generator 15 and a delta-sigma modulator 16. The waveform shaper 50 receives the triangular wave TWG which is a waveform signal outputted from the triangular wave generator 15, shapes the waveform in the predetermined amplitude range such that the amplitude settles outside this predetermined amplitude range, and supplies the shaped waveform to the delta-sigma modulator 16.

Figure 16:
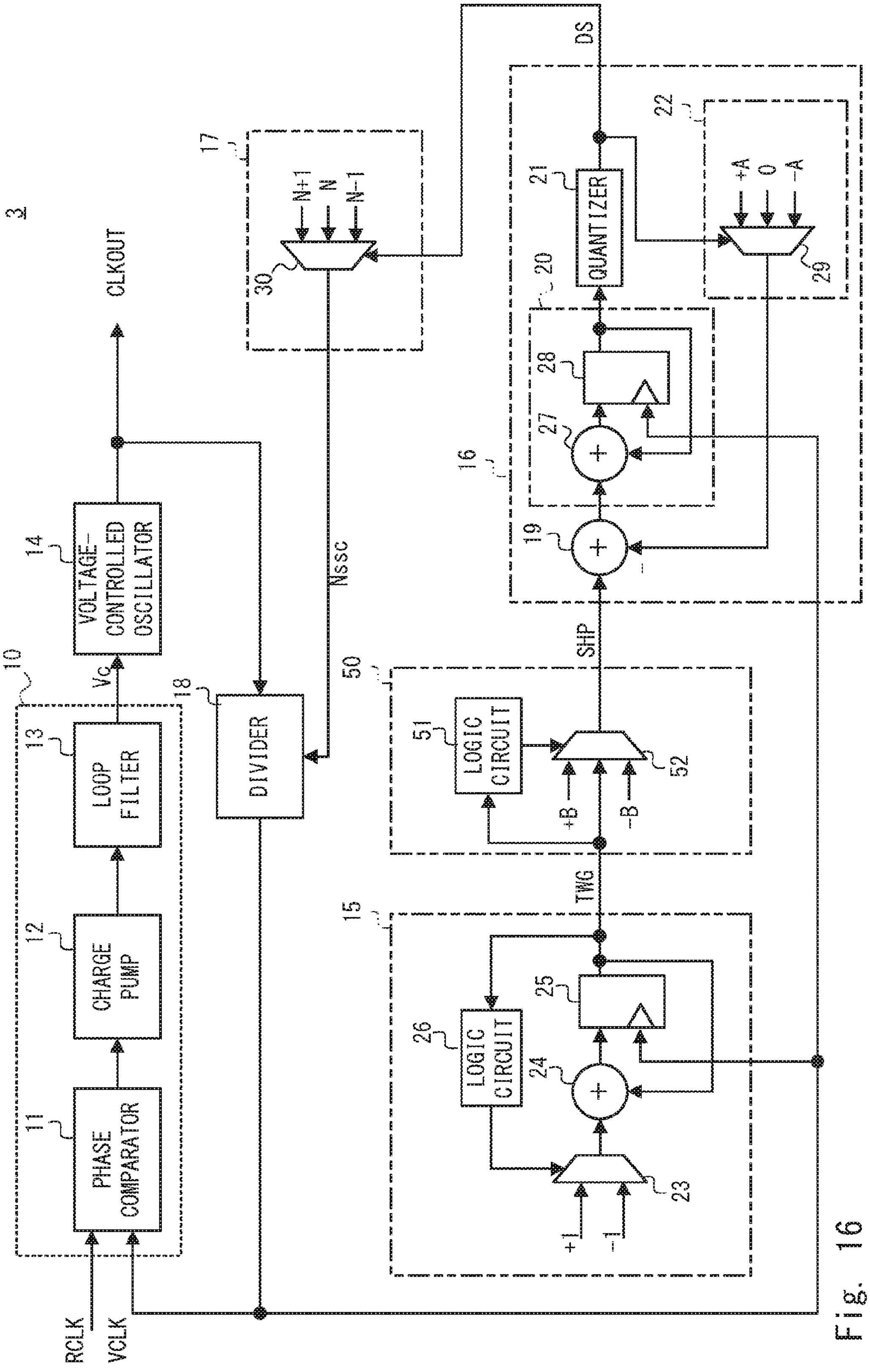
FIG. 16 is a circuit diagram illustrating an example of a circuit configuration of the SSCG according to the third embodiment.

Next, a specific example of a circuit configuration which realizes the SSCG 3 will be described. FIG. 16 is a circuit diagram illustrating an example of the circuit configuration of the SSCG 3. As illustrated in FIG. 16, the SSCG 3 differs from the circuit configuration of the SSCG 1 according to the first embodiment illustrated in FIG. 6 in that the waveform shaper 50 is added. In an example illustrated in FIG. 16, the waveform shaper 50 includes a logic circuit 51 and a selector 52. The logic circuit 51 determines whether or not the amplitude of the triangular wave TWG outputted from the triangular wave generator 15 is in a range equal to or more than 0 and less than +B and in a range larger than −B and less than 0. A signal of a determination result of the logic circuit 51 is outputted to the selector 52. The selector 52 selects and outputs one of +B, −B and output values from the triangular wave generator 15 according to a signal from the logic circuit 51. According to this configuration, the waveform shaper 50 changes an amplitude value to +B when the amplitude of the triangular wave TWG is in the range equal to or more than 0 and less than +B, and changes the amplitude value to −B when the amplitude of the triangular wave TWG is in the range larger than −B and less than 0. Further, the delta-sigma modulator 16 performs delta-sigma modulation based on a waveform signal outputted from the waveform shaper 50.

Figure 17:
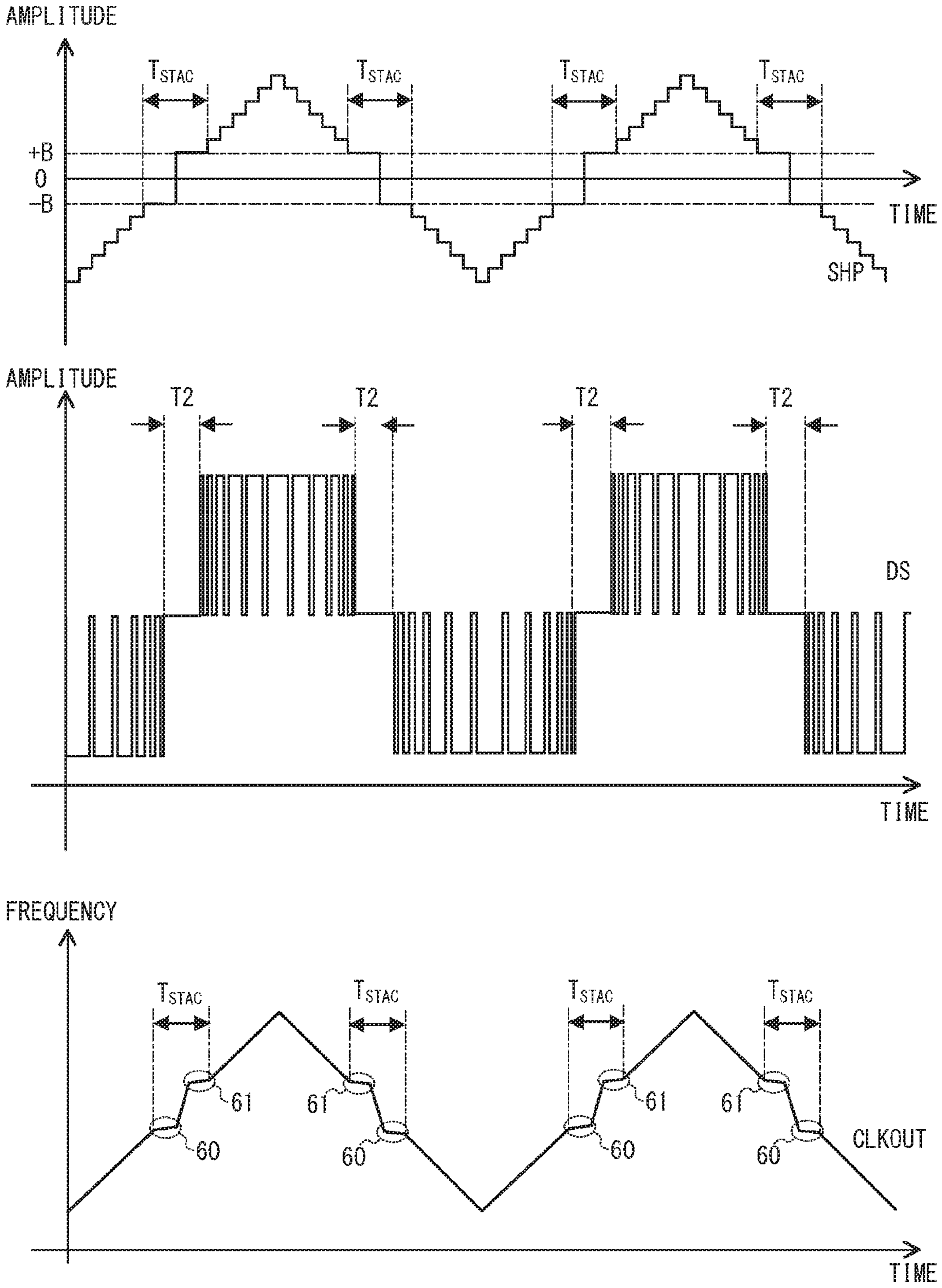
FIG. 17 illustrates graphs illustrating operation waveforms of the SSCG according to the third embodiment.

FIG. 17 shows graphs illustrating operation waveforms of the SSCG 3 according to the third embodiment. In addition, in FIG. 17, the upper graph illustrates a temporal transition of the amplitude of a shaped waveform signal SHP shaped by the waveform shaper 50, the middle graph illustrates a temporal transition of the output signal DS of the delta-sigma modulator 16, and the lower graph illustrates a temporal transition of the frequency of an output clock signal CLKOUT. As illustrated in the upper graph in FIG. 17, the waveform shaper 50 shapes the triangular wave TWG such that the amplitude settles outside the range of ±B. More specifically, the waveform shaper 50 changes an amplitude value to +B when the amplitude of the triangular wave TWG is in a range equal to or more than 0 and less than +B, and changes the amplitude value to −B when the amplitude is in the range larger than −B and less than 0. Thus, the waveform shaper 50 changes the amplitude value of the waveform in the predetermined amplitude range to a boundary value outside the predetermined amplitude range. In addition, a shaping target amplitude range only needs to be set to include amplitudes which cause stagnation of an output of the delta-sigma modulator. More specifically, in the present embodiment, as illustrated in the upper graph in FIG. 17, the amplitude range of the triangular wave TWG corresponding to a period TSTAC which is a period in which the output of the delta-sigma modulator 16 of the SSCG 1 according to the first embodiment stagnates is a shaping target. Meanwhile, the shaping target amplitude range does not necessarily need to include all amplitudes which cause stagnation of an output of the delta-sigma modulator, and may instead be set to include just some of the amplitudes.

The SSCG 1 according to the first embodiment produces a spurious component since the period TSTAC in which an output value of the delta-sigma modulator 16 stagnates at a fixed value becomes lower than a filter band fc of the SSCG 1 and therefore the frequency of the output clock signal CLKOUT also follows the waveform of the output value of the delta-sigma modulator 16 which has stagnated at a fixed value. In contrast to this, in the present embodiment, the waveform shaper 50 performs shaping processing for clipping the waveform such that the amplitude of the triangular wave TWG does not settle in the predetermined range. Thus, a period T2 in which the output value of the delta-sigma modulator 16 according to the present embodiment stagnates at a fixed value becomes shorter than the period TSTAC of the delta-sigma modulator 16 according to the first embodiment. As a result, the period in which the output of the delta-sigma modulator 16 is fixed is prevented from being lowered to a filter band fc or less. Meanwhile, according to this countermeasure, the amplitude of the waveform inputted to the delta-sigma modulator 16 temporarily stagnates at +B or −B, and therefore, as illustrated in the lower graph in FIG. 17, the frequency of the output clock signal CLKOUT also changes following this stagnation and two stagnations 60 and 61 occur. However, a stagnation period of this stagnation is shorter than that of a stagnation caused by a fixed output of the delta-sigma modulator 16, and, as a result, it is possible to reduce a spurious component compared to the SSCG 1 according to the first embodiment. The output clock signal CLKOUT of the SSCG 1 according to the first embodiment stagnates at one frequency only for the time duration of the period TSTAC. In contrast to this, according to the present embodiment, as illustrated in the upper graph in FIG. 17, the waveform corresponding to the period TSTAC is shaped to divide the stagnation of the output clock signal CLKOUT according to the first embodiment into the stagnations 60 and 61 of the two frequencies. By this means, it is possible to reduce the stagnation time of the output clock signal CLKOUT of the SSCG 3 according to the present embodiment to ½ or less of the time duration of the period TSTAC. Consequently, it is possible to improve peak power of a spurious component by at least 6 db (=20 log (½)).

Figure 18:
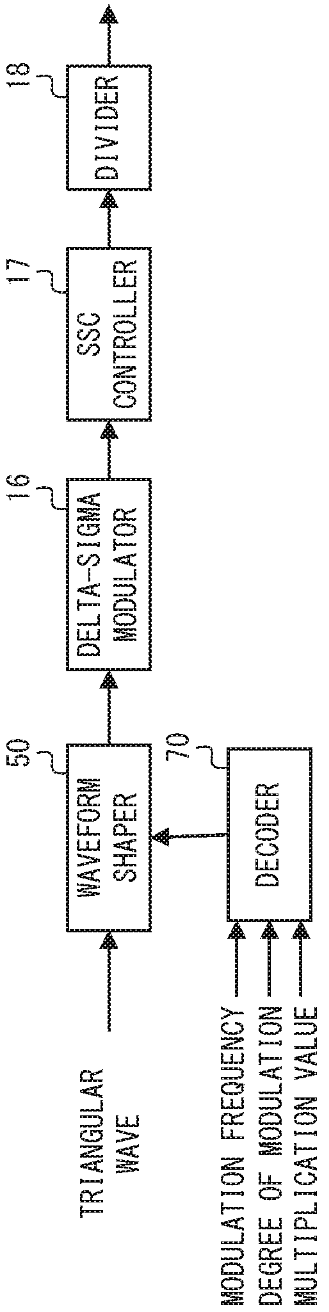
FIG. 18 is a block diagram illustrating part of a configuration of the SSCG according to a modified example of the third embodiment.

The SSCG 3 according to the third embodiment has been described. In addition, the threshold used by the waveform shaper 50, i.e., above +B or −B may be automatically set based on a modulation frequency which is the frequency of the triangular wave TWG, the degree of modulation for determining the degree of spreading and a multiplication number (i.e., the above-described multiplication number N) for determining a multiplication number of the SSCG. In an example illustrated in FIG. 18, a decoder circuit 70 determines the above boundary value, i.e., an amplitude threshold for waveform shaping based on the frequency of a waveform signal, the degree of modulation for spreading the spectrum of an output clock signal and a multiplication number, and outputs the setting signal to the waveform shaper 50. An operation of a stagnation of an output of the delta-sigma modulator 16 is determined based on the modulation frequency, the degree of modulation and the multiplication number. Hence, the decoder circuit 70 receives an input of the modulation frequency, the degree of modulation and the multiplication number, and outputs a setting signal corresponding to the input to the waveform shaper 50. The waveform shaper 50 sets the amplitude threshold for waveform shaping based on the setting signal outputted from the decoder circuit 70. According to this configuration, the amplitude threshold for waveform shaping is automatically set based on the frequency of a waveform signal, the degree of modulation and the multiplication number, so that it is possible to provide the SSCG which can support arbitrary spectrum spreading.

Figure 19:
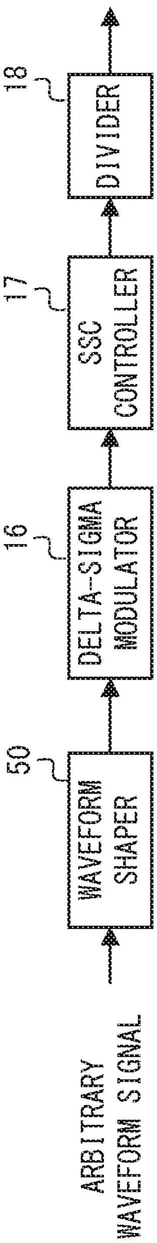
FIG. 19 is a block diagram illustrating part of the configuration of the SSCG according to the modified example of the third embodiment.
Figure 20:
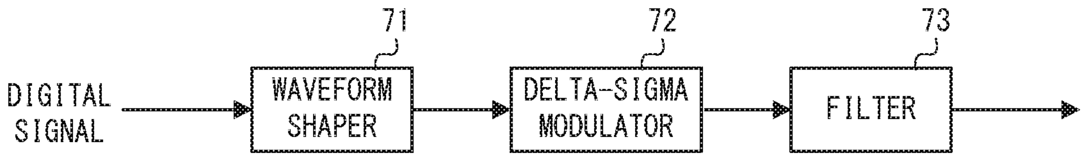
FIG. 20 is a block diagram illustrating a configuration which uses a wave shaper in a digital-analog converter which performs digital sigma modulation.

The waveform shaper 50 receives the triangular wave in the above description. However, as illustrated in FIG. 19, the waveform shaper 50 may receive other arbitrary waveform signals in addition to triangular waves, and shape waveforms. Further, the waveform shaper 50 may be used not only for the SSCG but also for a digital/analog converter which uses digital sigma modulation as illustrated in FIG. 20. The digital/analog converter illustrated in FIG. 20 includes a waveform shaper 71 which shapes the waveform of a digital signal which is not yet analog converted, a delta-sigma modulator 72 which delta-sigma modulates an output waveform of the waveform shaper 71 and a filter 73 which functions as a low pass filter. Similar to the third embodiment, according to this configuration, the waveform shaper 71 shapes the digital signal which is not yet analog converted to prevent a value input to the delta-sigma modulator 72 from becoming close to an output value of a feedback circuit of the delta-sigma modulator 72. As a result, it is possible to prevent the analog signal which has passed through the filter 73 from being fixed to a given value.

Further, a configuration where the delta-sigma modulator outputs 1.5 bits (ternary values) has been described in the first to third embodiments. However, a delta-sigma modulator which outputs 2 bits (quaternary values) or more may naturally be used. In addition, the number of quantization thresholds of a quantizer of the delta-sigma modulator also increases as the number of bits increases, and therefore the number of amplitude ranges which need to be shaped by the waveform shaper 50 increases accordingly. Further, a waveform signal for controlling spreading of the spectrum of an output clock signal is not limited to a triangular wave, either.

Furthermore, the second and third embodiments may be combined to configure an SSCG. This combination can provide an effect of reducing a spurious component based on a threshold interval and an effect of reducing a spurious based on waveform shaping, and therefore is more effective.

The invention made by the inventors has been specifically based on the embodiments. However, the present invention is not limited to the above-described embodiments, and can be naturally variously changed without departing from the spirit of the prevent invention.

The first to third embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that Applicant's intent is to encompass equivalents of all claim elements, even if amended later during prosecution.

What is claimed is:

1. A clock generator comprising:

a phase comparing unit that receives a reference clock signal and a feedback clock signal, and generates a control voltage corresponding to a phase difference between the reference clock signal and the feedback clock signal;

a voltage-controlled oscillator that oscillates at an oscillating frequency corresponding to the control voltage, and generates an output clock signal;

a waveform generator circuit that receives the feedback clock signal, and generates a waveform signal;

a delta-sigma modulator that receives the waveform signal;

a control circuit that controls a multiplication number according to an output signal of the delta-sigma modulator; and a divider that generates the feedback clock signal by dividing the output clock signal according to the multiplication number controlled by the control circuit, and supplies the feedback clock signal to the phase comparing unit, wherein the delta-sigma modulator outputs bits larger than 1 bit based on the waveform signal.

2. The clock generator according to claim 1, wherein the multiplication number used by the divider to divide the output clock signal takes on an integer value.

3. A clock generator comprising:

a phase comparing unit that receives a reference clock signal and a feedback clock signal, and generates a control voltage corresponding to a phase difference between the reference clock signal and the feedback clock signal;

a voltage-controlled oscillator that oscillates at an oscillating frequency corresponding to the control voltage, and generates an output clock signal;

a waveform generator circuit that receives the feedback clock signal, and generates a waveform signal;

a delta-sigma modulator that receives the waveform signal;

a control circuit that controls a multiplication number according to an output signal of the delta-sigma modulator;

a divider that generates the feedback clock signal by dividing the output clock signal according to the multiplication number controlled by the control circuit, and supplies the feedback clock signal to the phase comparing unit, wherein the delta-sigma modulator outputs bits larger than 1 bit based on the waveform signal, and wherein the multiplication number used by the divider to divide the output clock signal takes on a value which is an integer multiple of 0.5.

4. A clock generator comprising:

a phase comparing unit that receives a reference clock signal and a feedback clock signal, and generates a control voltage corresponding to a phase difference between the reference clock signal and the feedback clock signal;

a voltage-controlled oscillator that oscillates at an oscillating frequency corresponding to the control voltage, and generates an output clock signal;

a waveform generator circuit that receives the feedback clock signal, and generates a waveform signal;

a delta-sigma modulator that receives the waveform signal;

a control circuit that controls a multiplication number according to an output signal of the delta-sigma modulator; and a divider that generates the feedback clock signal by dividing the output clock signal according to the multiplication number controlled by the control circuit, and supplies the feedback clock signal to the phase comparing unit, wherein the delta-sigma modulator outputs bits larger than 1 bit based on the waveform signal, wherein the delta-sigma modulator includes:

an integrator circuit, a quantizer that quantizes an integration value of the integrator circuit, and a decoder that feeds back an output of the quantizer to an input of the delta-sigma modulator, the integrator circuit integrates a difference signal between the waveform signal and an output signal of the decoder, and a threshold interval of quantization performed by the quantizer includes a threshold interval less than a quantization interval.

5. A clock generator comprising:

a phase comparing unit that receives a reference clock signal and a feedback clock signal, and generates a control voltage corresponding to a phase difference between the reference clock signal and the feedback clock signal;

a voltage-controlled oscillator that oscillates at an oscillating frequency corresponding to the control voltage, and generates an output clock signal;

a waveform generator circuit that receives the feedback clock signal, and generates a waveform signal;

a delta-sigma modulator that receives the waveform signal;

a control circuit that controls a multiplication number according to an output signal of the delta-sigma modulator;

a divider that generates the feedback clock signal by dividing the output clock signal according to the multiplication number controlled by the control circuit, and supplies the feedback clock signal to the phase comparing unit, wherein the delta-sigma modulator outputs bits larger than 1 bit based on the waveform signal, a waveform shaper that receives the waveforms signal, shapes a waveform in a predetermined amplitude range such that an amplitude settles outside the predetermined amplitude range, and supplies the shaped waveform to the delta-sigma modulator.

6. The spread spectrum clock generator according to claim 5, wherein the waveform shaper changes an amplitude value of the waveform in the predetermined amplitude range to a boundary value outside the predetermined amplitude range.

7. The spread spectrum clock generator according to claim 6, further comprising a decoder circuit that determines the boundary value based on a frequency of the waveform signal, a degree of modulation for spreading a spectrum of the output clock signal and the multiplication number.

8. The spread spectrum clock generator according to claim 1, wherein the waveform signal is a triangular wave signal.

9. The spread spectrum clock generator according to claim 1, wherein the delta-sigma modulator outputs ternary values.

* * * * *